(12) United States Patent
Wang et al.

(10) Patent No.: US 9,824,937 B1
(45) Date of Patent: Nov. 21, 2017

(54) FLOWABLE CVD QUALITY CONTROL IN STI LOOP

(71) Applicant: Taiwan Semiconductor Manufacturing Company, Ltd., Hsin-Chu (TW)

(72) Inventors: Tsan-Chun Wang, Hsin-Chu (TW); Liang-Yin Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/253,231

(22) Filed: Aug. 31, 2016

(51) Int. Cl.
| | |
|---|---|
| *H01L 29/66* | (2006.01) |
| *H01L 21/8238* | (2006.01) |
| *H01L 21/3115* | (2006.01) |
| *H01L 21/02* | (2006.01) |
| *H01L 21/324* | (2006.01) |
| *H01L 27/092* | (2006.01) |
| *H01L 29/06* | (2006.01) |
| *H01L 29/10* | (2006.01) |
| *H01L 21/762* | (2006.01) |
| *H01L 29/78* | (2006.01) |

(52) U.S. Cl.
CPC ........... *H01L 21/823878* (2013.01); *H01L 21/02271* (2013.01); *H01L 21/31155* (2013.01); *H01L 21/324* (2013.01); *H01L 21/76224* (2013.01); *H01L 21/823821* (2013.01); *H01L 27/0924* (2013.01); *H01L 29/0649* (2013.01); *H01L 29/1083* (2013.01); *H01L 29/66795* (2013.01); *H01L 29/785* (2013.01)

(58) Field of Classification Search
CPC ... H01L 21/02518; H01L 21/64; H01L 21/70; H01L 21/8232; H01L 29/66007; H01L 29/66409
See application file for complete search history.

(56) References Cited

U.S. PATENT DOCUMENTS

| | | | | |
|---|---|---|---|---|
| 2013/0221491 | A1* | 8/2013 | Wann | H01L 21/823431 257/618 |
| 2014/0080276 | A1* | 3/2014 | Brand | H01L 29/66803 438/283 |
| 2016/0056156 | A1* | 2/2016 | Ghani | H01L 21/823821 257/401 |
| 2016/0079034 | A1* | 3/2016 | Yieh | H01L 21/26506 427/526 |

\* cited by examiner

*Primary Examiner* — Cheung Lee
(74) *Attorney, Agent, or Firm* — Slater Matsil, LLP

(57) ABSTRACT

A method for semiconductor processing includes forming a first dielectric layer comprising an N-type dopant over a first plurality of fins extending above a first region of a substrate, forming a second dielectric layer comprising a P-type dopant over the first plurality of fins and a second plurality of fins extending above a second region of the substrate, the second dielectric layer overlying the first dielectric layer, and forming an isolation layer between adjacent ones of the first plurality of fins, and between adjacent ones of the second plurality of fins. The method further includes performing an implantation process using a first dopant, the implantation process changing an etching rate of the isolation layer, and recessing the isolation layer, the first dielectric layer, and the second dielectric layer, where after the recessing, the first and the second plurality of fins extend above an upper surface of the isolation layer.

20 Claims, 21 Drawing Sheets

FLOWABLE CVD QUALITY CONTROL IN STI LOOP

TECHNICAL FIELD

The present invention relates generally to structures of and methods for forming isolation regions of semiconductor devices, and, in particular embodiments, to structures of and methods for forming shallow trench isolation (STI) regions of Fin Field Effect Transistors (FinFETs).

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As transistor sizes decrease, the size of each feature decreases. One such feature is the shallow trench isolation (STI) used between active areas to isolate one semiconductor device from another and another is the inter-layer dielectric (ILD) between gate structures. Feature size reduction often results in increased aspect ratios because the widths of the openings are smaller but the depths are often the same as before. Techniques used to fill openings (e.g. STIs in substrates or ILDs between gate structures) having lower aspect ratios may provide poor filling results for openings of advanced technologies having high aspect ratios, such as aspect ratios of 8:1 or more.

One alternative to improve filling pertains to using flowable dielectric materials. Flowable dielectric materials, as their name suggest, can flow to fill voids in a gap. Usually, various chemistries are added to the silicon-containing precursors to allow the deposited film to flow. After the flowable film is deposited, it is cured and then annealed to remove the added chemistry to form dielectric layer, e.g., silicon oxide. The flowable film is usually cured and annealed at a high temperature, e.g., greater than 1000° C. to obtain desired mechanical property. In some manufacturing processes, lower temperatures (e.g., between 300° C. and 700° C.) are used to cure and anneal the flowable film due to, e.g., design constraints. When cured at such lower temperatures, mechanical properties, such as the wet etch rate (WER), of the flowable film degrades (e.g., having increased WER), and dishing might occur when the flowable film is recessed by a subsequent process such as a wet etch process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
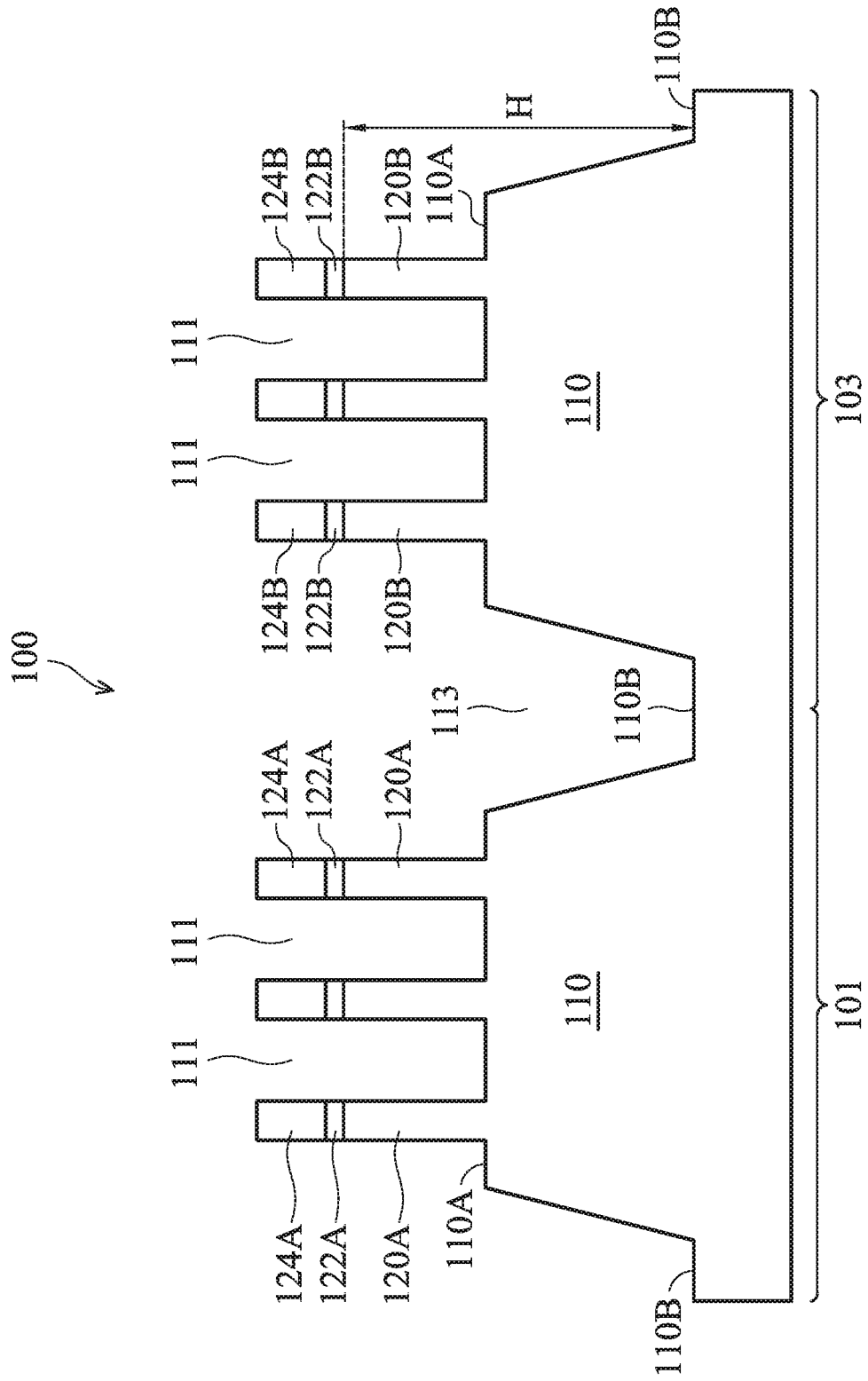
FIGS. 1-11 are cross-sectional views of a FinFET at various manufacturing stages, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed unless otherwise stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various aspects of the present disclosure pertain to structures of and methods for forming isolation regions in a semiconductor device. In particular, structures of and methods for forming STI regions of a FinFET using flowable chemical vapor deposition (FCVD) process are disclosed. In some embodiments, a phosphosilicate glass (PSG) film and a borosilicate glass (BSG) film are formed over semiconductor fins in a PMOS region and an NMOS region of a semiconductor device, respectively. A flowable film is formed by an FCVD process between the fins. The wet etch rate (WER) of the flowable film is modified by an implantation process, before the flowable film is recessed to form STI regions with substantially flat upper surfaces. PSG film and BSG film over upper surfaces of the STI regions are removed by the recessing process. Subsequently, anti-punch through (APT) regions are formed in semiconductor strips underlying the fins by a high temperature thermal anneal process.

Referring to FIG. 1, the cross-sectional view of a semiconductor device 100 with a plurality of semiconductor fins 120A/120B (also referred to as fins 120A/120B) extending from substrate 110 is illustrated. In the example of FIG. 1, semiconductor device 100 has a first region 101 and a second region 103. First region 101 may be a PMOS region 101 used for fabricating P-type semiconductor devices, e.g., p-channel metal-oxide-semiconductor field-effect transistors (PMOSFETs), and second region 103 may be an NMOS region 103 used for fabricating N-type semiconductor devices, e.g., n-channel metal-oxide-semiconductor field-effect transistors (NMOSFETs). Although FIG. 1 shows two regions 101 and 103 with three fins 120A/120B in each region, semiconductor device 100 may include other numbers of fins 120A/120B and other numbers of regions, such as one or more than two regions, and that different regions of semiconductor device 100 may be of the same or different types (e.g., PMOS region or NMOS region). The discussion hereinafter uses the example of a PMOS region 101 and an NMOS region 103 for illustration purpose, one skilled in the art, upon reading this disclosure, will be able to apply the principles of this disclosure to semiconductor devices with other numbers and/or types of regions with any numbers of fins.

Referring to FIG. 1, substrate 110 may be a semiconductor substrate, such as a bulk semiconductor, a semiconductor-on-insulator (SOI) substrate, or the like, which may be doped (e.g., with a P-type or an N-type dopant) or undoped. Substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Semiconductor devices, or partially finished semiconductor devices, such as transistors, capacitors, resistors, diodes, or like, may be formed on or in substrate 110.

To form the plurality of fins 120 (e.g., fins 120A in PMOS region 101 and fins 120B in NMOS region 103), substrate 110 may be patterned using, for example, photolithography techniques. For example, a mask layer, such as a pad oxide layer 122 (e.g., 122A and 122B) and an overlying pad nitride layer 124 (e.g., 124A and 124B), may be formed over the substrate 110. The pad oxide layer may be a thin film comprising silicon oxide formed, for example, using a thermal oxidation process. The pad oxide layer 122 may act as an adhesion layer between the substrate 110 and the overlying pad nitride layer 124 and may act as an etch stop layer for etching the pad nitride layer 124. In some embodiments, the pad nitride layer 124 is formed of silicon nitride, for example, formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is patterned to define pad oxide layer 122 and pad nitride layer 124, which collectively comprise a patterned mask 124A/122A in region 101 and 124B/122B in region 103.

The patterned mask is subsequently used to pattern exposed portions of the substrate 110 to form trenches, e.g., trenches 111 and 113, thereby defining the plurality of fins 120 between adjacent trenches, as illustrated in FIG. 1. As illustrated in FIG. 1, patterned pad oxide layer 122 (e.g., 122A in region 101 and 122B in region 103) and patterned pad nitride layer 124 (e.g., 124A in region 101 and 124B in region 103) are disposed over fins 120. In the example of FIG. 1, trenches 113 extend further into substrate 110 than trenches 111 due to, e.g., more etching being performed in the areas of substrate 110 that correspond to trenches 113. As illustrated in FIG. 1, fins 120 extend from an upper surface 110A of substrate 110. Upper surface 110B of substrate 110, which forms the bottom of trenches 113, is lower than upper surface 110A in FIG. 1. The depth of trench 113, defined as the distance between the upper surface of fins 120 and upper surface 110B, is about 1200 angstrom (Å), in some embodiments. In other embodiments, fins can be formed by epitaxially growing material in a trench formed in a dielectric layer on the substrate.

Figure 2:
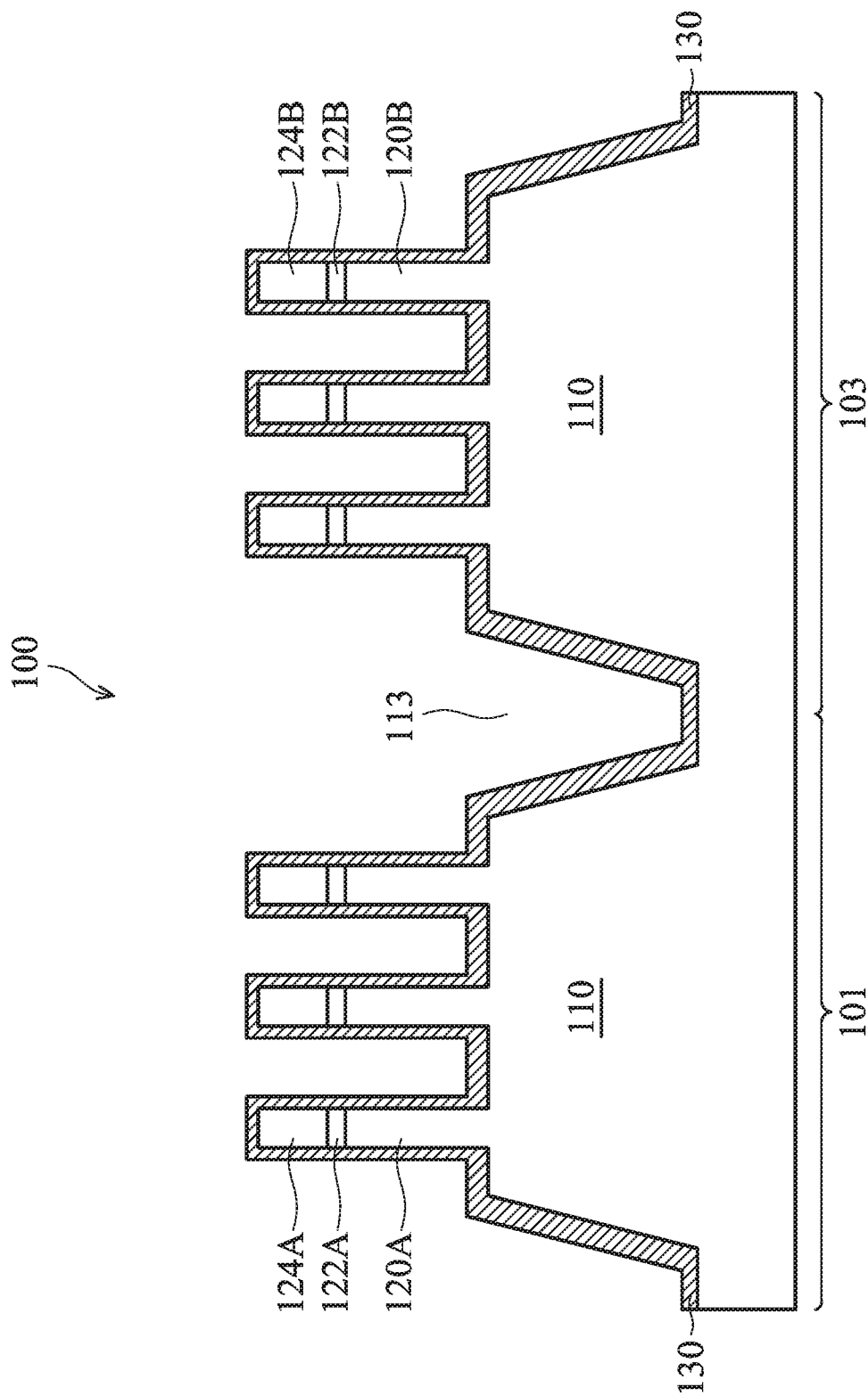

Referring to FIG. 2, a dielectric film 130 is formed over fins 120 and substrate 110. Dielectric film 130 comprises one or more N-type dopants, such as phosphorus, arsenic, the like, or combinations thereof, and is formed using any suitable deposition methods such as chemical vapor deposition (CVD) or plasma-enhanced CVD (PECVD), as example. In an exemplary embodiment, dielectric film 130 is a phosphorous-containing film, such as a PSG film. In the discussion hereinafter, dielectric film 130 may be referred to as PSG film 130, with the understanding that other suitable films may also be used. PSG film 130 may be conformally formed over fins 120, patterned mask 122/124, and substrate 110, and a thickness of PSG film 130 may range from about 1 nanometer (nm) to about 6 nm, although other dimensions are also possible depending on, e.g., design requirements and/or process technology (e.g., 40 nm, 28 nm) used, in various embodiments.

Figure 3:
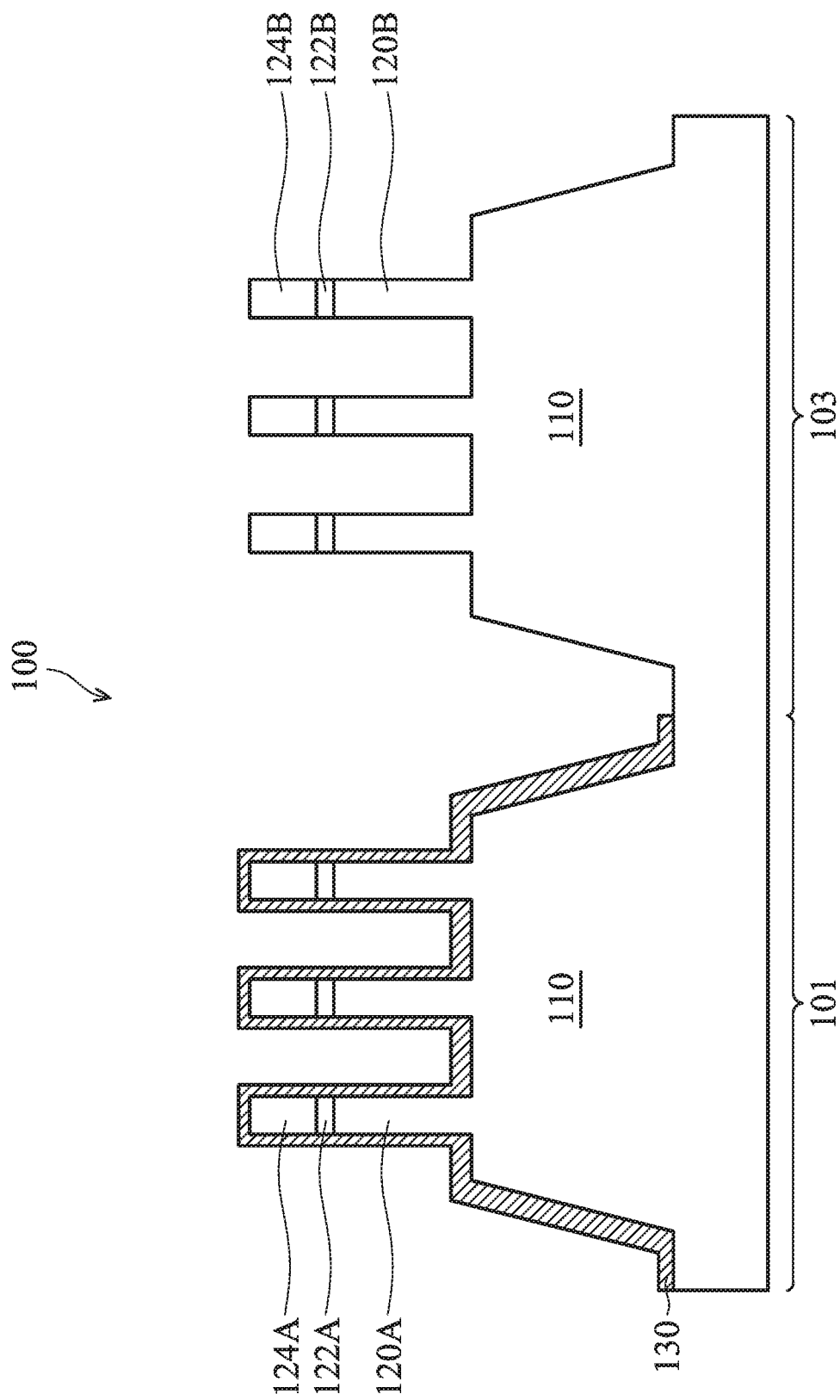

Next, as illustrated in FIG. 3, PSG film 130 is removed from NMOS region 103 using any suitable removal process, e.g., lithography and etching. PSG film 130 over PMOS region 101 remains after the removal process, and will be used for forming anti-punch through (APT) regions (see APT regions 129A in FIG. 11) in subsequent processing.

Figure 4:
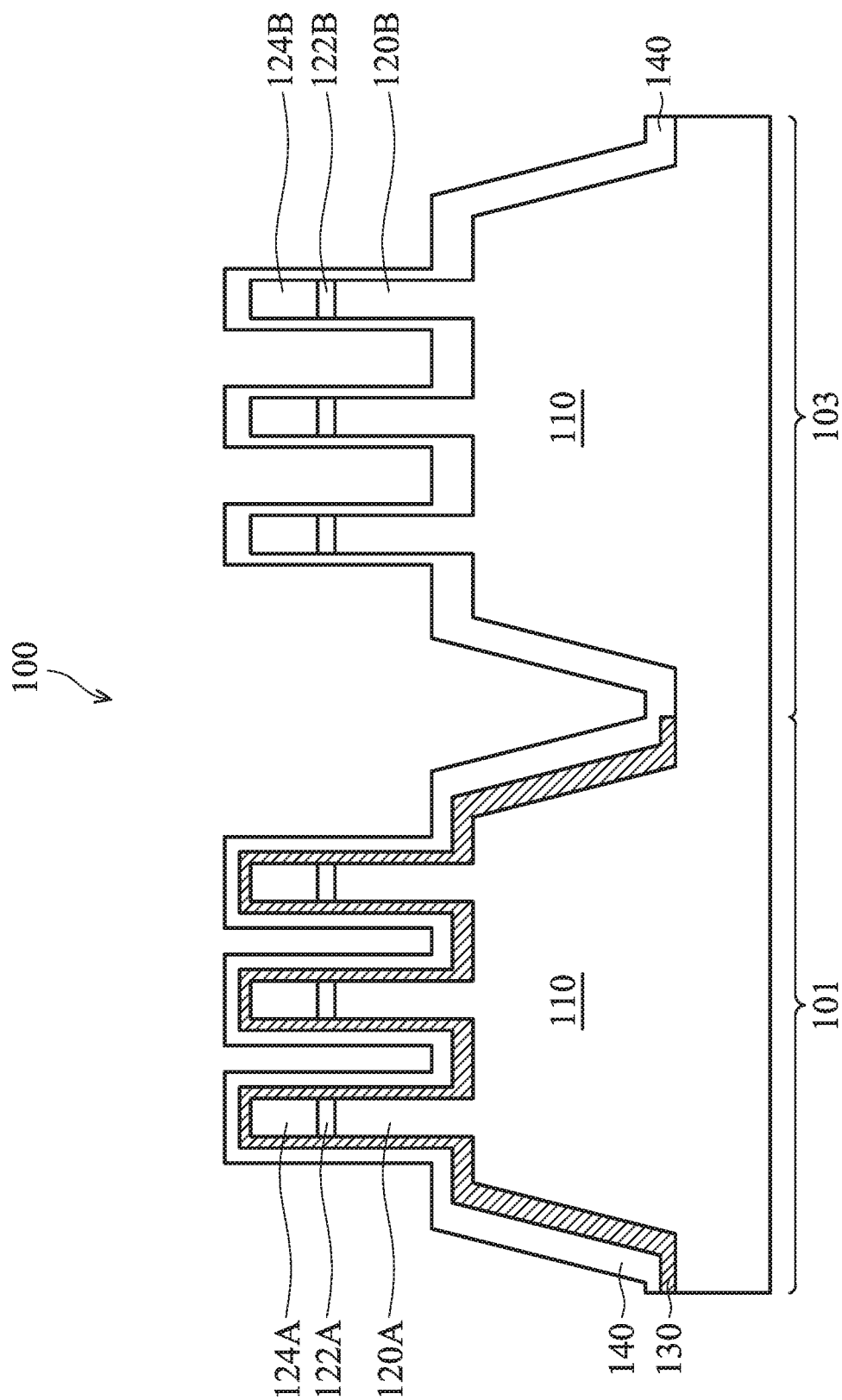

Referring to FIG. 4, a dielectric film 140 is formed over PSG film 130, fins 120, patterned mask 122/124, and substrate 110. Dielectric film 140 comprises one or more P-type dopants, such as boron, and is formed using any suitable deposition methods such as CVD or PECVD, as examples. In an exemplary embodiment, dielectric film 140 is a boron-containing film, such as a BSG film. In the discussion hereinafter, dielectric film 140 may be referred to as BSG film 140, with the understanding that other suitable films may also be used. BSG film 140 may be conformally formed. A thickness of BSG film 140 may range from about 1 nm to about 6 nm, although other dimensions are also possible depending on, e.g., design requirements and/or process technology (e.g., 40 nm, 28 nm) used, in various embodiments. Note that BSG film 140 in PMOS region 101 does not have to be removed, since PSG film 130 may act as a diffusion barrier in subsequent processing to reduce or prevent the dopant (e.g., boron) of film 140 from diffusing into fins 120A.

Figure 5:
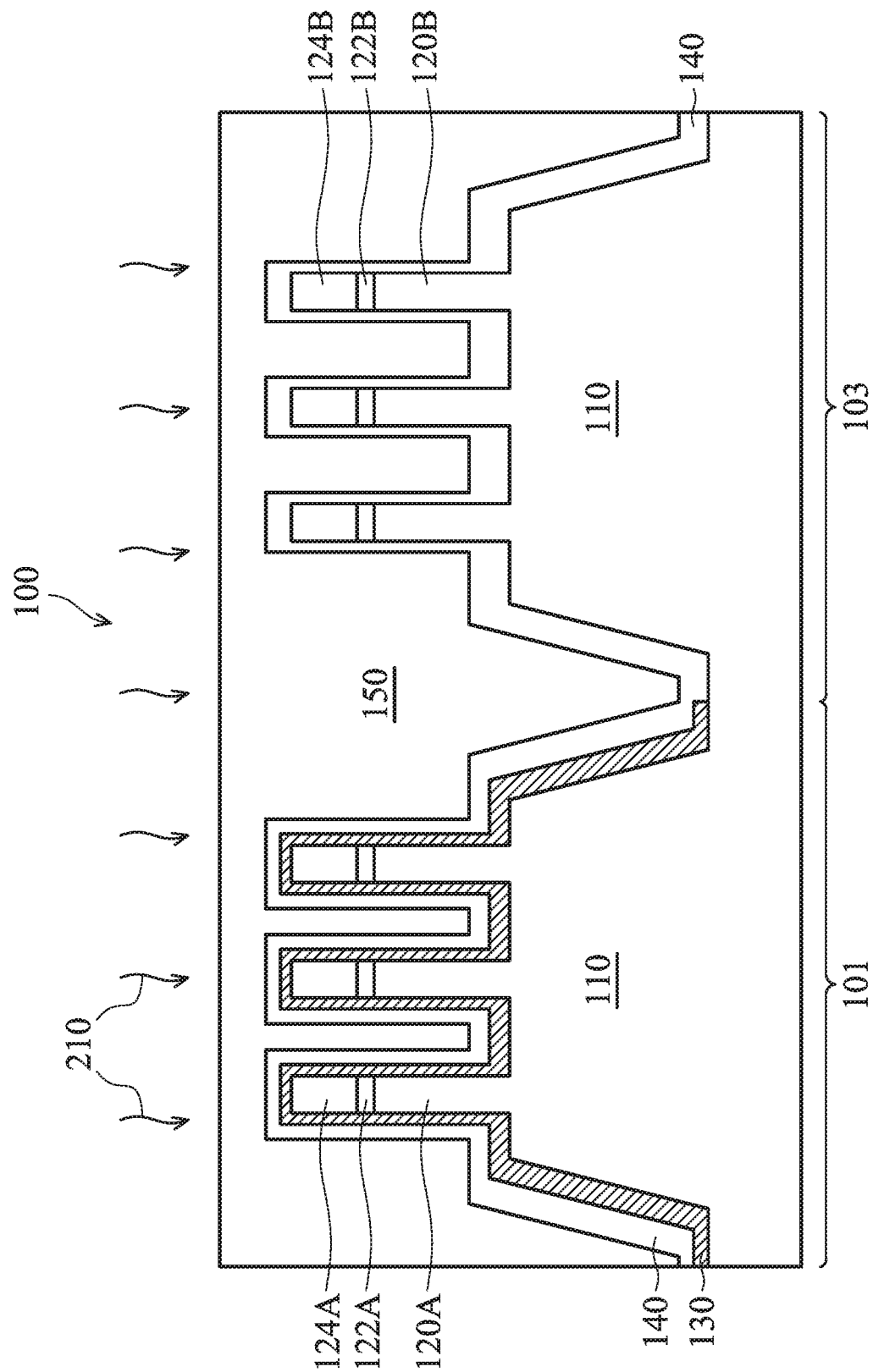

Next, referring to FIG. 5, a dielectric film 150 is formed over BSG film 140 to fill the trenches (e.g., trenches 111 and 113 in FIG. 1). Dielectric material 150 as deposited may extend over upper surfaces of fins 120 (e.g., over upper surfaces of BSG film 140). In subsequent processing, dielectric material 150 is cured and recessed to form STI regions, as will be described in more details hereinafter.

Dielectric film 150 may be formed by an FCVD process. In an FCVD process, a first silicon-containing precursor is introduced into a deposition chamber with semiconductor device 100 present. In some embodiments, the silicon-containing precursor is a polysilazane. Polysilazanes are polymers having a basic structure composed of silicon and nitrogen atoms in an alternating sequence. In polysilazanes, each silicon atom is usually bound to two nitrogen atoms, or each nitrogen atom is bound to two silicon atoms, so that these can be described predominantly as molecular chains of the formula $[R_1R_2Si-NR_3]_n$. R1-R3 can be hydrogen atoms or organic substituents. When only hydrogen atoms are present as substituents, the polymers are referred to as perhydropolysilazanes $[H_2Si-NH]_n$. If organic substituents are bound to silicon and/or nitrogen, the compounds are referred to as organopolysilazanes.

In some embodiments, the silicon-containing precursor is a silylamine, such as trisilylamine (TSA), disilylamine (DSA), or a combination thereof. One or more carrier gases may also be included with the silicon-containing precursor. The carrier gases may include helium (He), argon (Ar), nitrogen ($N_2$), the like, or a combination thereof.

Next, a second precursor is provided to the deposition chamber. In some embodiments, the second precursor is a nitrogen-containing precursor. The nitrogen-containing precursor may include $NH_3$, $N_2$, the like, or a combination thereof. In some embodiments, the nitrogen-containing precursor is activated into plasma in a remote plasma system (RPS) outside of the deposition chamber. An oxygen source gas, such as $O_2$ or the like may be included with the nitrogen-containing precursor and activated into plasma in the RPS. Plasma generated in the RPS is carried into the deposition chamber by a carrier gas, which includes He, Ar, $N_2$, the like, or a combination thereof, in some embodiments.

In the deposition chamber, the silicon-containing precursor and the nitrogen-containing precursor mix and react to deposit a film 150 containing silicon and nitrogen over semiconductor device 100. In some embodiments, the deposited film 150 has flowable characteristics. The flowable nature of the formation allows film 150 to flow into narrow gaps, trenches and other structures on the deposition surface of semiconductor device 100.

Still referring to FIG. 5, after the FCVD deposition process, an anneal process 210 is performed to cure the deposited film 150. Anneal process 210 is a thermal anneal process performed at a temperature between about 300° C. and about 700° C., such as about 550° C., and for a duration of several hours, in some embodiments. Dry anneal or wet anneal may be used. Anneal processes help to break the Si—N and Si—H bond in film 150 and promote the formation of Si—Si and Si—O bond, in some embodiments. Having more Si—Si and Si—O bonds improves the mechanical properties (e.g., hardness) of dielectric film 150, in accordance with some embodiments. Due to the overall thickness of the deposited film 150, anneal process 210 may convert only top portions (e.g., portions proximate upper surface of film 150) of film 150 to form stronger Si—O bonding, thereby improving the mechanical properties (e.g., hardness) of film 150, at least in the top portions. A harder film 150 may facilitate subsequent removal processes such as a chemical mechanical planarization (CMP) process used to recess dielectric film 150.

In anneal process 210 of FIG. 5, low temperature (e.g., between about 300° C. to about 700° C.) anneal is used to advantageously reduce or prevent interface oxidation and diffusion of dopants (e.g., phosphorous in PSG film 130 and boron in BSG film 140) into fins 120A/120B at this stage of manufacturing. For example, the low temperature anneal process 210 reduces or prevents diffusion of phosphorous in PSG film 130 and boron in BSG film 140 into the channel regions of fins 120A and 120B, respectively, thereby reducing or preventing damage to the channel regions. The low temperature anneal process 210, however, may result in poor mechanical properties. For example, the WER of film 150 after the low temperature anneal process may be about twice the WER of a film annealed at high temperature (e.g., higher than 1000° C.). If left untreated, film 150 may exhibit divots (sometimes referred to as dishing) after a subsequent wet etch process, resulting in a non-flat upper surface (also referred to as fin recess non-uniformity) for STI regions and inconsistencies in the fin height. As described in subsequent processing of the present disclosure, an implantation process 240 (see FIG. 9) is performed to improve the mechanical and/or physical properties of film 150, thereby reducing or preventing fin recess non-uniformity. As a result, the methods disclosed in the present disclosure enjoys the benefit of low-temperature anneal, and at the same time, avoids or reduces fin recess non-uniformity.

Figure 6:
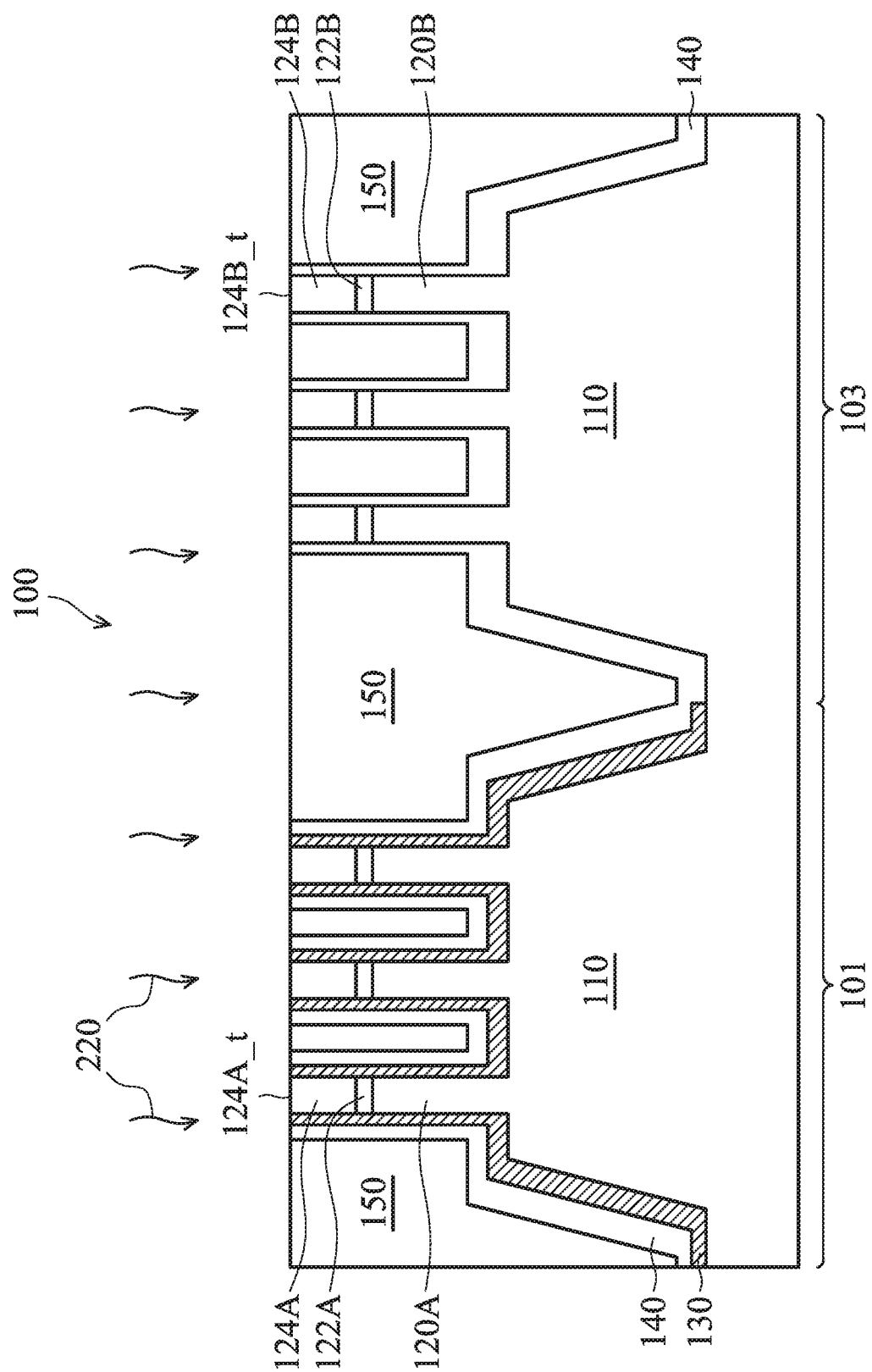

Referring to FIG. 6, a planarization process such as a CMP process is performed to remove top portions of film 150 and obtain a substantially level upper surface for film 150. Pad nitride layers 124A and 124B may function as an etch stop layer for the CMP process. After the CMP process, top surfaces 124A_t and 124B_t of pad nitride layers 124A and 124B are exposed, in some embodiments. After the planarization process, another low temperature anneal process 220 is performed to further convert the remaining portions of film 150 and improve the mechanical properties of film 150, in some embodiments. Anneal process 220 may be performed under similar conditions as anneal process 210. For example, anneal process 220 may be a thermal anneal process performed at a temperature between about 300° C. and about 700° C., such as about 550° C., and for a duration of several hours. Dry anneal or wet anneal may be used.

Figure 7:
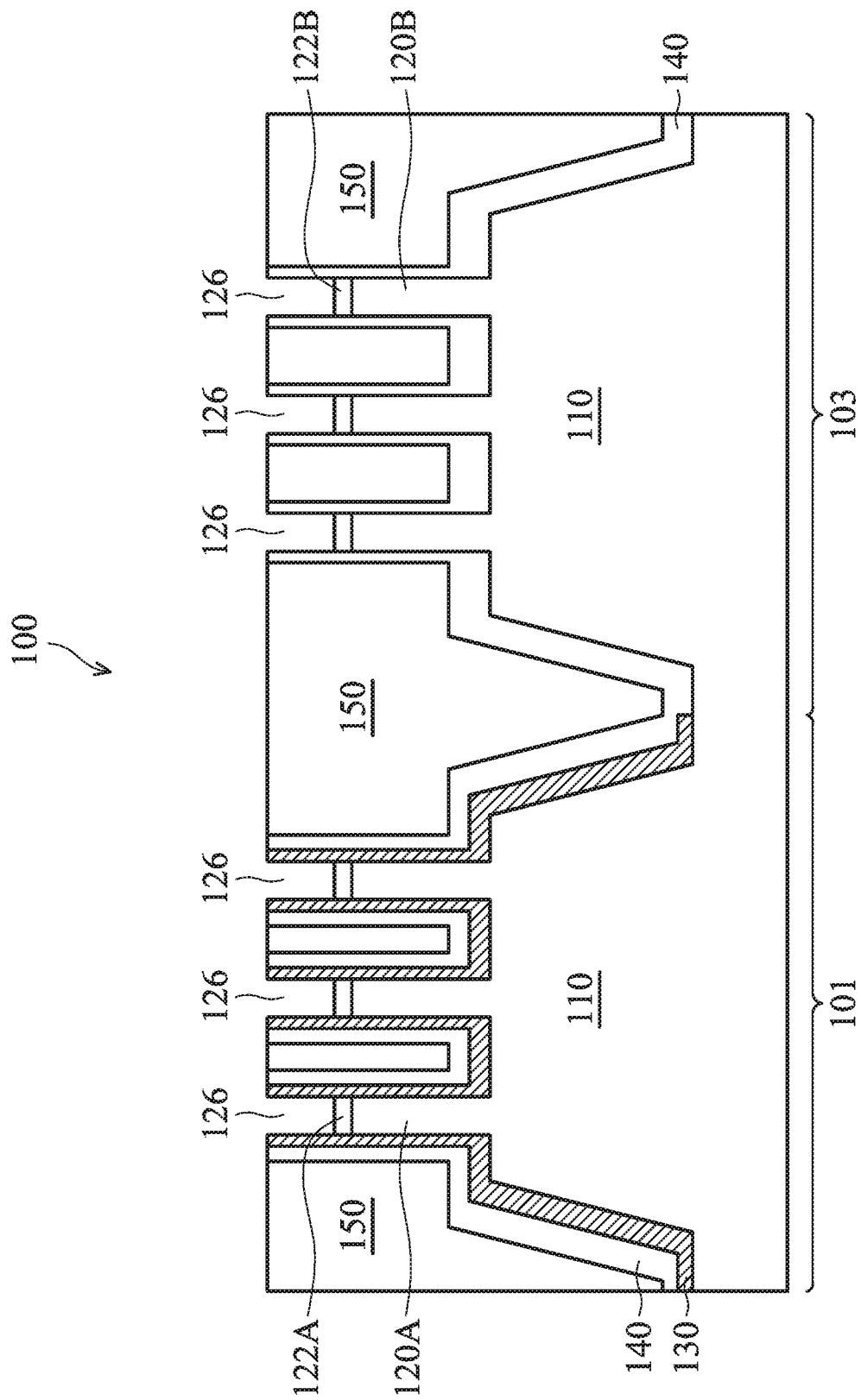

Next, as shown in FIG. 7, pad nitride layers 124A and 124B are removed, and recesses 126 are formed exposing pad oxide layers 122A and 122B. In some embodiments, pad nitride layers 124A and 124B are selectively removed using a removal process that removes pad nitride layers 124A and 124B without attacking other layers (e.g., PSG film 130, BSG film 140 and film 150). For example, pad nitride layers 124A/124B, if formed of silicon nitride, may be removed by a wet process using hot $H_3PO_4$.

Figure 8:
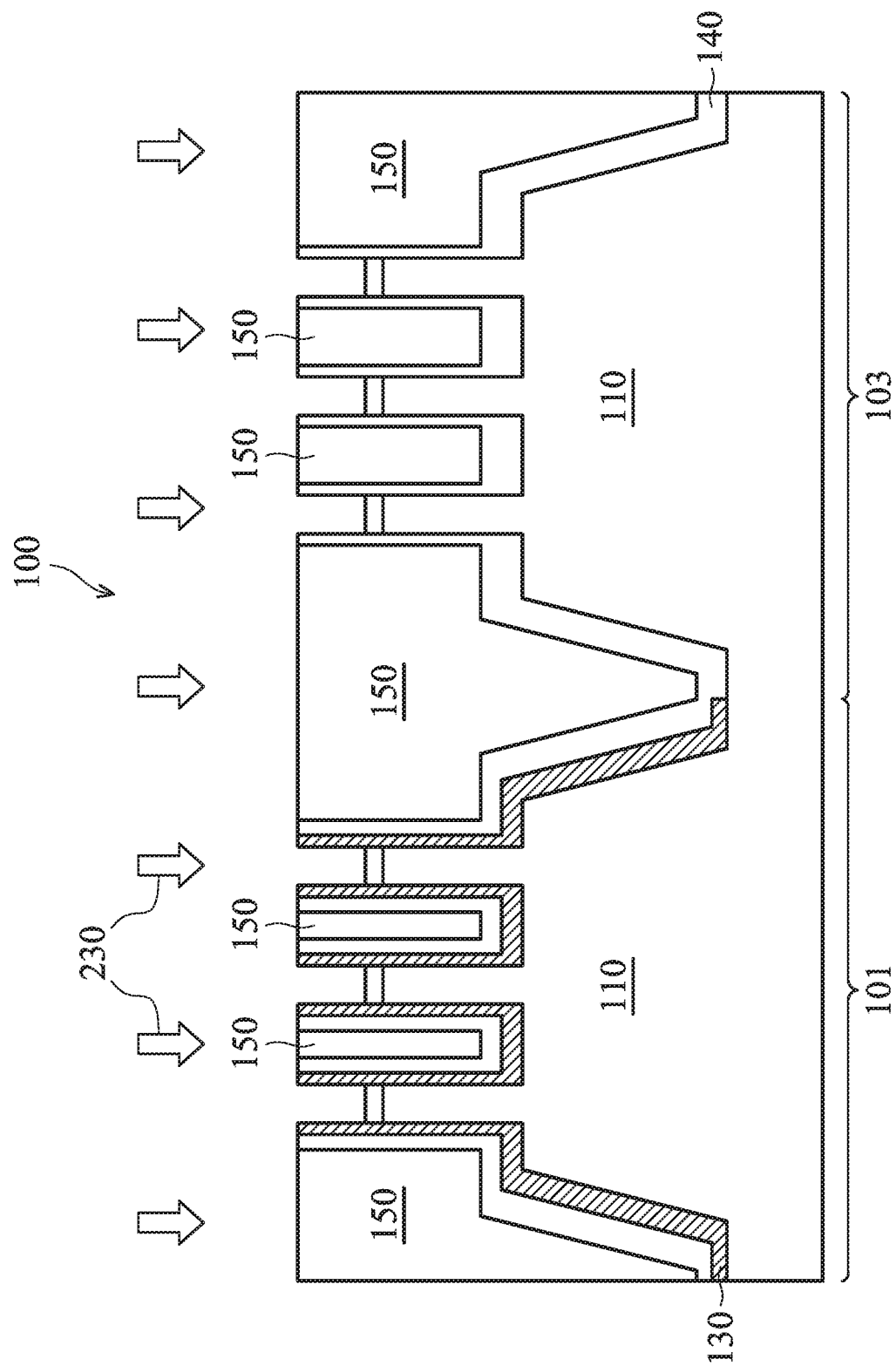

Referring to FIG. 8, well-loop process 230 is performed to form the well regions of semiconductor device 100 using methods known in the art. Well-loop process 230 forms P-wells and N-wells for semiconductor device 100, and may comprises a plurality of processing steps performed sequentially. The plurality of processing steps may include forming N-wells in PMOS region 101 while NMOS region 103 is shielded by, e.g., a patterned photo resist layer (not shown), and forming P-wells in NMOS region 103 while PMOS region 101 is shielded by a mask layer such as a photo resist. P-type or N-type dopant may be implanted by an implantation process to form the P-wells or N-wells, for example. Well-loop process is known in the art, and details are not repeated herein.

Figure 9:
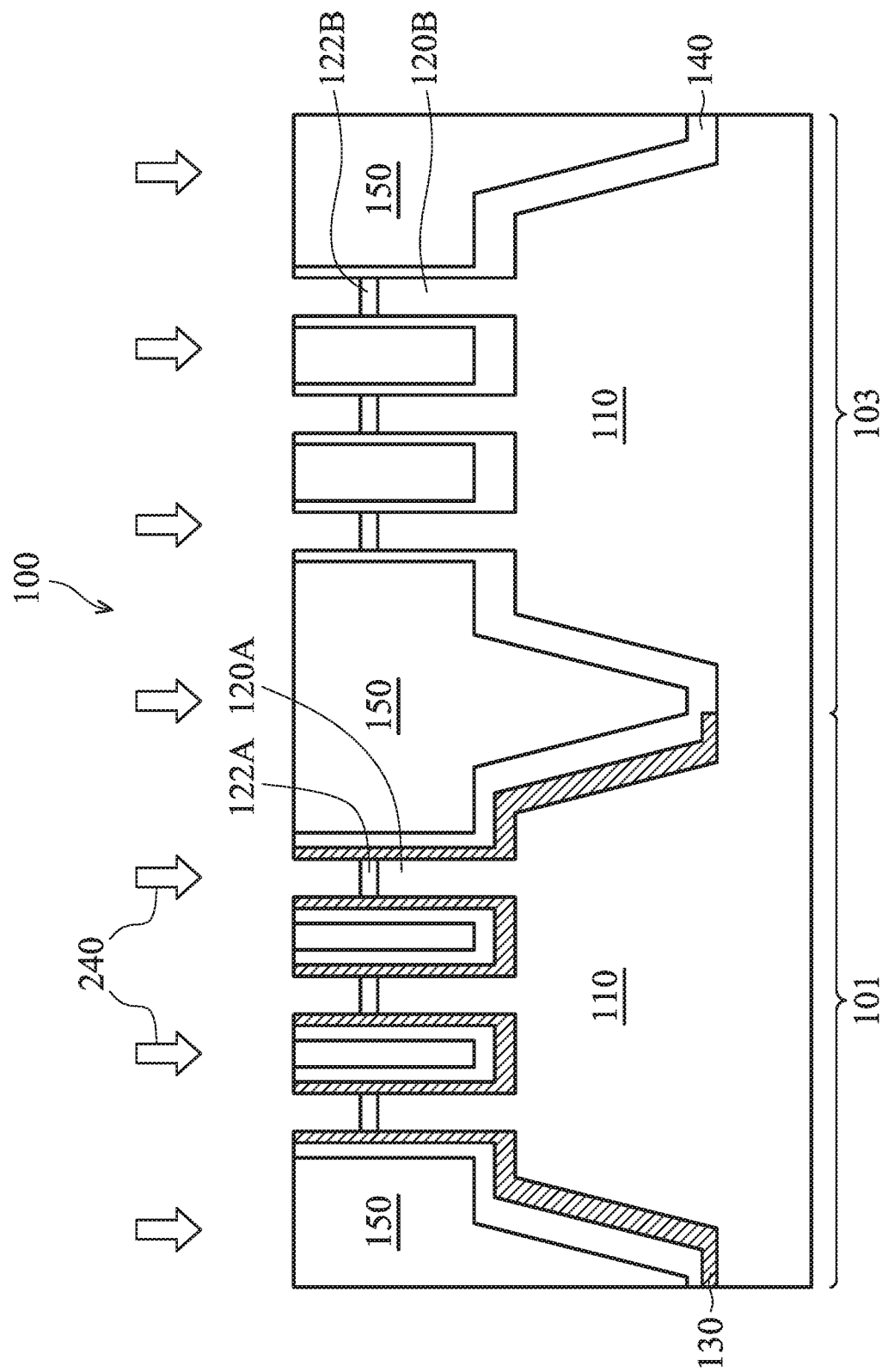

Next, referring to FIG. 9, an implantation process 240 is performed to modify the mechanical and/or physical properties (e.g., hardness and/or etching rate, such as WER) of film 150. In an exemplary embodiment, helium ($H_e$) is used as the dopant of implantation process 240, which is performed with an implantation energy of about 3 keV to about 5 keV, at a temperature between about 200° C. and about 500° C., and at a dosage of about $1E15$ $cm^{-2}$ to about $1E16$ $cm^{-2}$. For the embodiment above using $H_e$ as dopant, the projection range (PR) of implantation process 240, which describes the depth (measured from the surface of film 150)

of the region in film 150 having a peak dopant concentration, is about 600 angstrom (Å); the precise material modification (PMM) region of implantation process 240, which describes the range of depth for regions in film 150 having dopant concentrations within $1/\sqrt{2}$ of the peak dopant concentration, is about 1200 Å. Therefore, in the embodiment above, the region with a peak dopant concentration is about 600 Å below the surface of film 150, and regions extending from the surface of film 150 to a depth of about 1200 Å have dopant concentrations within $1/\sqrt{2}$ of the peak dopant concentration.

Figure 10:
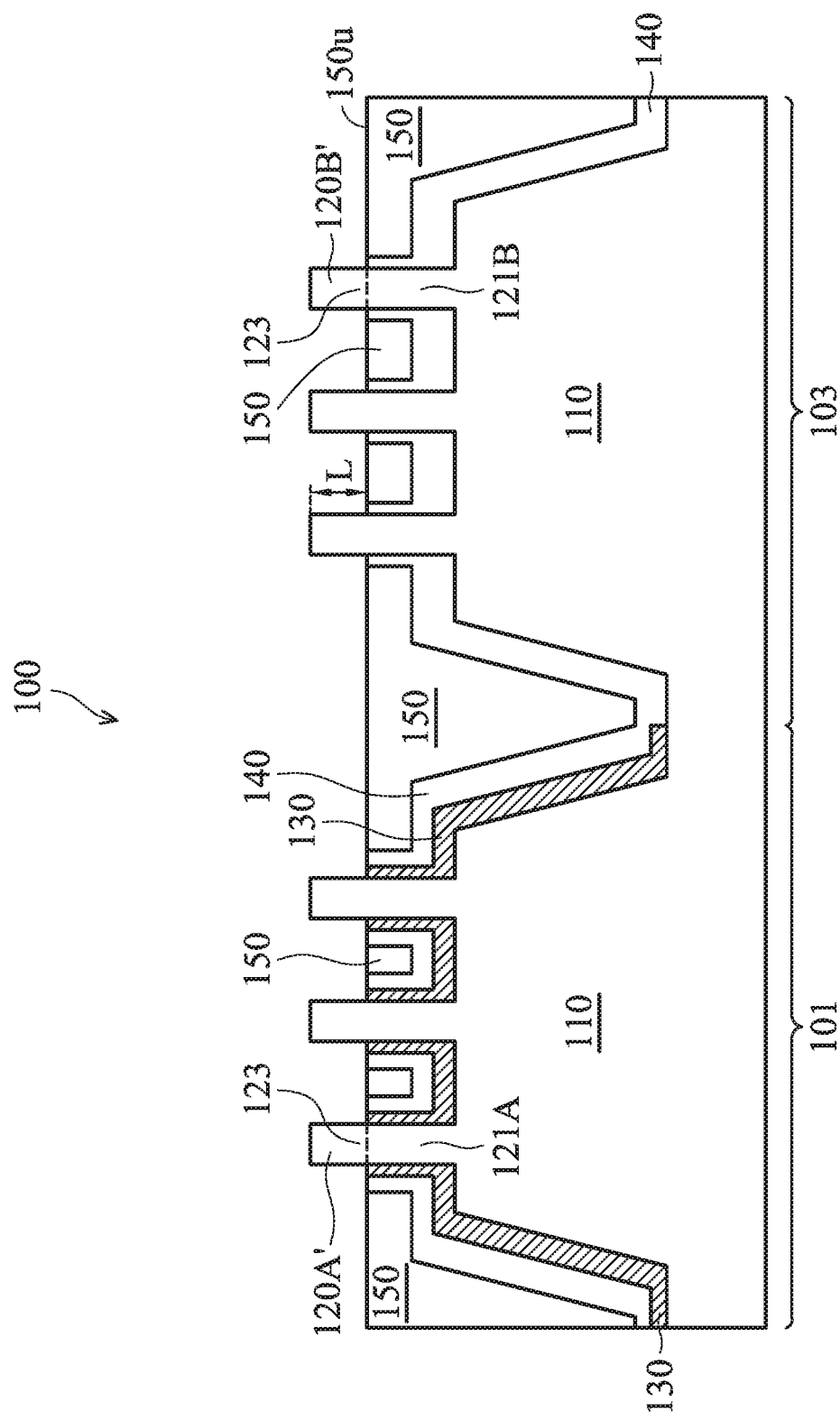

Implantation process 240 improves the qualities of film 150. For example, the WER of film 150 after the low temperature anneal process 210/220 is about 100 Å/minute, while the WER of film 150 after treatment by implantation process 240 is about 50 Å/minute, thus achieving about 2× improvement in the WER of film 150, which advantageously reduces fin-recess non-uniformity in subsequent processing to recess film 150 to form STI regions, as illustrated in FIG. 10. Since $H_e$ has a light mass, little or no damage is incurred to fins 120A/120B during implantation process 240. For example, fins 120A/120B after implantation process 240 maintain straight sidewall profiles and flat upper surfaces, with substantially right angles at the corners of sidewalls and upper surfaces of fins 120A/120B. Therefore, by using light mass dopant such as He, qualities of film 150 is improved (e.g., 2×WER improvement) with little or no degradation of device performance due to fin damage. In some embodiments, dopant such as $H_e$, $O_2$, $N_2$, C, or combinations thereof, may be used as the dopant for implantation process 240. The dopants listed above are merely examples, other suitable dopant that could modify the qualities of film 150 (e.g., WER) with little or no damage to fins 120 may also be used and are within the scope of the present disclosure. In addition, skilled artisan will appreciate that implantation process 240 could be used to modify qualities of other layers (e.g., ILD layers) formed by an FCVD process.

Figure 18:
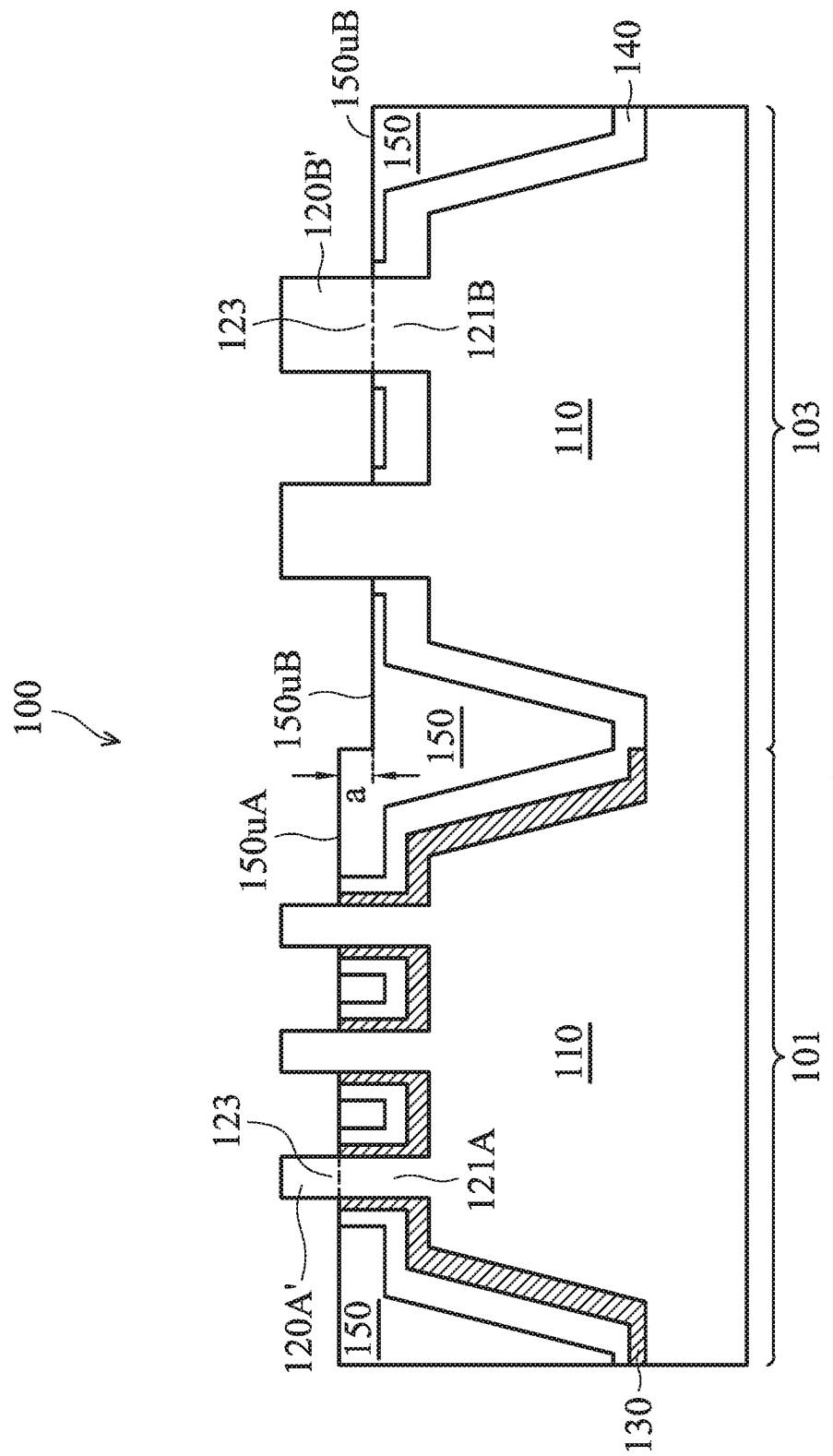

Next, referring to FIG. 10, film 150 is recessed by a suitable etch process (also referred to as a recess process) such as a wet etch process and/or a dry etch process, and the remaining portions of film 150 after the recess process form STI regions 150. In a wet etch process, etchant such as diluted HF acid may be used to recess film 150. Diluted HF acid also removes pad oxide layer 122A/122B during the wet etch process, in some embodiments. In accordance with some embodiments of the present disclosure, the recessing of film 150 is performed using a dry etch method, where process gases including $NH_3$ and HF are used. Portions of PSG film 130 and portions of BSG film 140 that are above upper surface 150U of STI regions 150 are removed during the recess process (e.g., a dry etch process and a wet etch process), in some embodiments, although they may also be removed after the recess process using one or more etchant that selectively removes PSG film 130 and/or BSG film 140, if the etchant used in the recess process does not remove PSG film 130 and/or BSG film 140. Due to the improved quality (e.g., improved WER) of film 150, a substantially flat upper surface 150U for STI regions 150 is obtained after the recess process. After STI regions 150 are formed, upper portions 120A'/120B' of fins 120A/120B extend above upper surface 150U of STI regions 150 and are referred to as upper fins 120A' and 120B', whereas lower portions 121A/121B of fins 120A/120B extend below upper surface 150U of STI regions 150 and are referred to as semiconductor strips 121A/121B. Dashed lines 123 in FIG. 10 and FIG. 18 illustrate the boundaries between upper fins 120A'/120B' and semiconductor strips 121A/121B. For simplicity, dashed lines 123 are not illustrated for all fins and in all figures.

The substantially flat upper surface 150U of STI regions 150 reduces loss of fin height L, which is defined as the distance between the upper surface of upper fin 120A' (or 120B') and the upper surface of STI regions 150 contacting upper fin 120A' (or 120B'). Without implantation process 240, upper surface of STI regions 150 may exhibit dishing after the recess process (e.g., wet etch process) used to form STI regions 150, with STI regions contacting upper fins 120A'/120B' being higher than STI regions disposed midway between two adjacent fins, thus resulting in loss of fin height. Due to implantation process 240, a substantially flat upper surface 150U is formed, which improves fin height consistency in the PMOS region and the CMOS region, resulting in improved on-current $I_{on}$ of semiconductor device 100, and improved uniformity for drain current $I_{drain}$. In addition, good well isolation and low leakage current are provided by the substantially flat upper surface 150U of STI regions 150.

Figure 11:
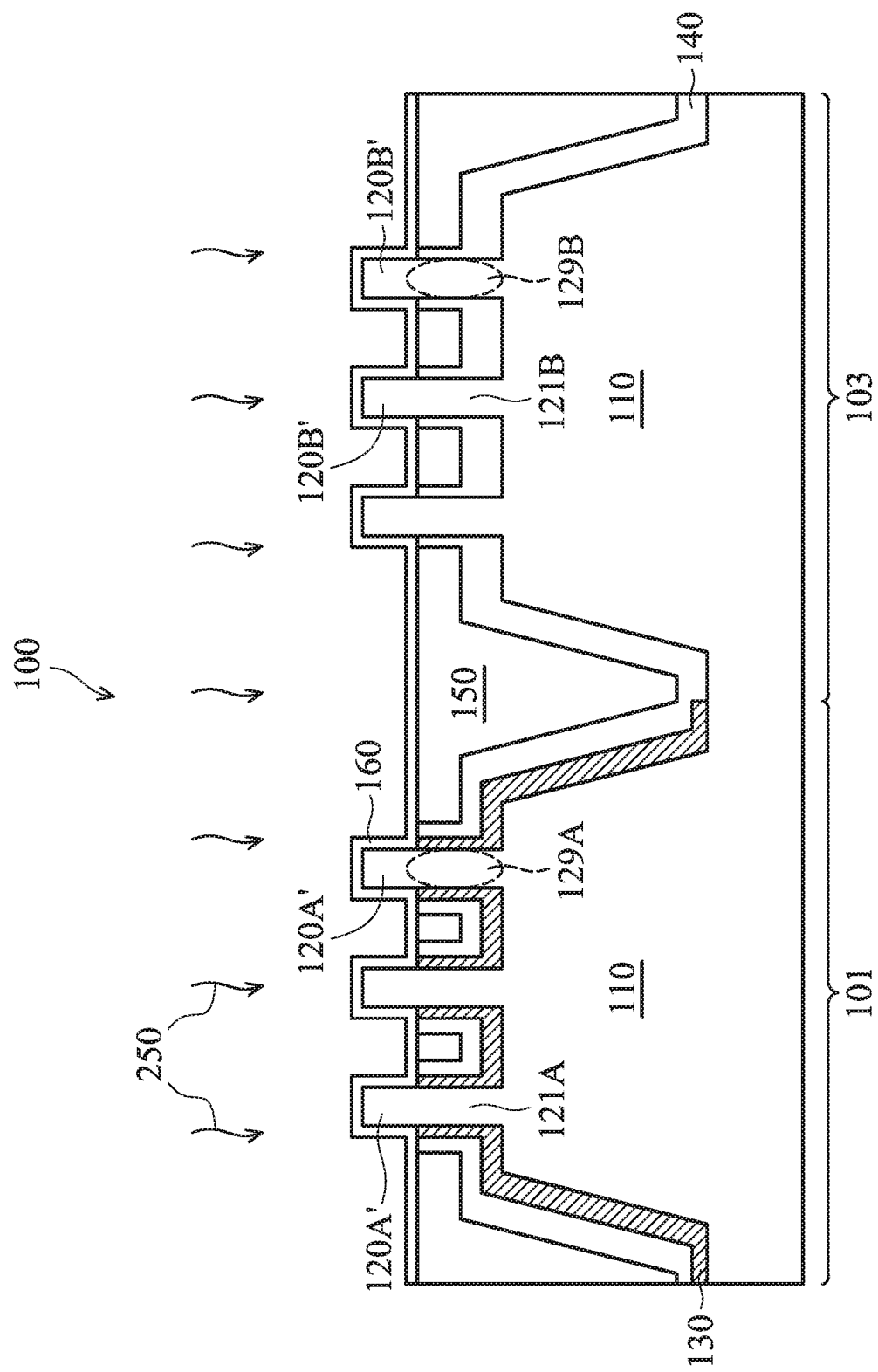

Next, referring to FIG. 11, a dielectric layer 160 is formed over upper fins 120A'/120B', PSG film 130, BSG film 140 and STI regions 150 using PVD, CVD, thermal oxidation, or other suitable formation methods. Dielectric layer 160 may comprises silicon oxide, silicon nitride, high-K dielectric material, or other suitable material, and may be used as gate dielectric in subsequent processing to form gate electrodes (not shown). After dielectric layer 160 is formed, a thermal anneal process 250 is performed at a temperature ranging from about 1000° C. to about 1300° C., for example about 1045° C., for a duration ranging from about 20 seconds to about 40 seconds, in some embodiments. The higher temperature (e.g., higher than 1000° C.) used in the thermal anneal process 250 drives the N-type dopant (e.g., phosphorus) of PSG film 130 into semiconductor strips 121A and P-type dopant (e.g., boron) of BSG film 140 into semiconductor strips 121B through diffusion, in some embodiments. As illustrated in FIG. 11, since PSG film 130 and BSG film 140 are disposed on sidewalls of semiconductor strips 121A and 121B, respectively, N-type dopant (e.g., phosphorus) and P-type dopant (e.g., boron) diffused respectively into semiconductor strips 121A and 121B, and form anti-punch through (APT) regions 129A and 129B, in various embodiments. In FIG. 11, APT regions 129A/129B are only illustrated for one semiconductor strip 121A in PMOS region 101 and one semiconductor strip 121B in NMOS region 103, with the understanding that all of the semiconductor strips 121 (e.g., 121A or 121B) may have APT regions 129 (e.g., 129A or 129B). Note that in PMOS region 101, PSG film 130 reduces or prevents the diffusion of P-type dopant of BSF film 140 into semiconductor strips 121A. Further processing (not shown) may be performed to finish the fabrication of FinFET device 100, and may include additional steps such as forming gate electrodes, interlayer dielectrics (ILDs), and contacts, as skilled artisans readily appreciate.

Since sidewalls of upper fins 120A'/120B' do not have PSG film 130 or BSG film 140, the dopants of PSG film 130 and BSG film 140, driven by high temperature thermal anneal process 250, diffuse into semiconductor strips 121A/121B, with little or no impact on the dopant level of upper fins 120A'/120B'.

Figure 20:
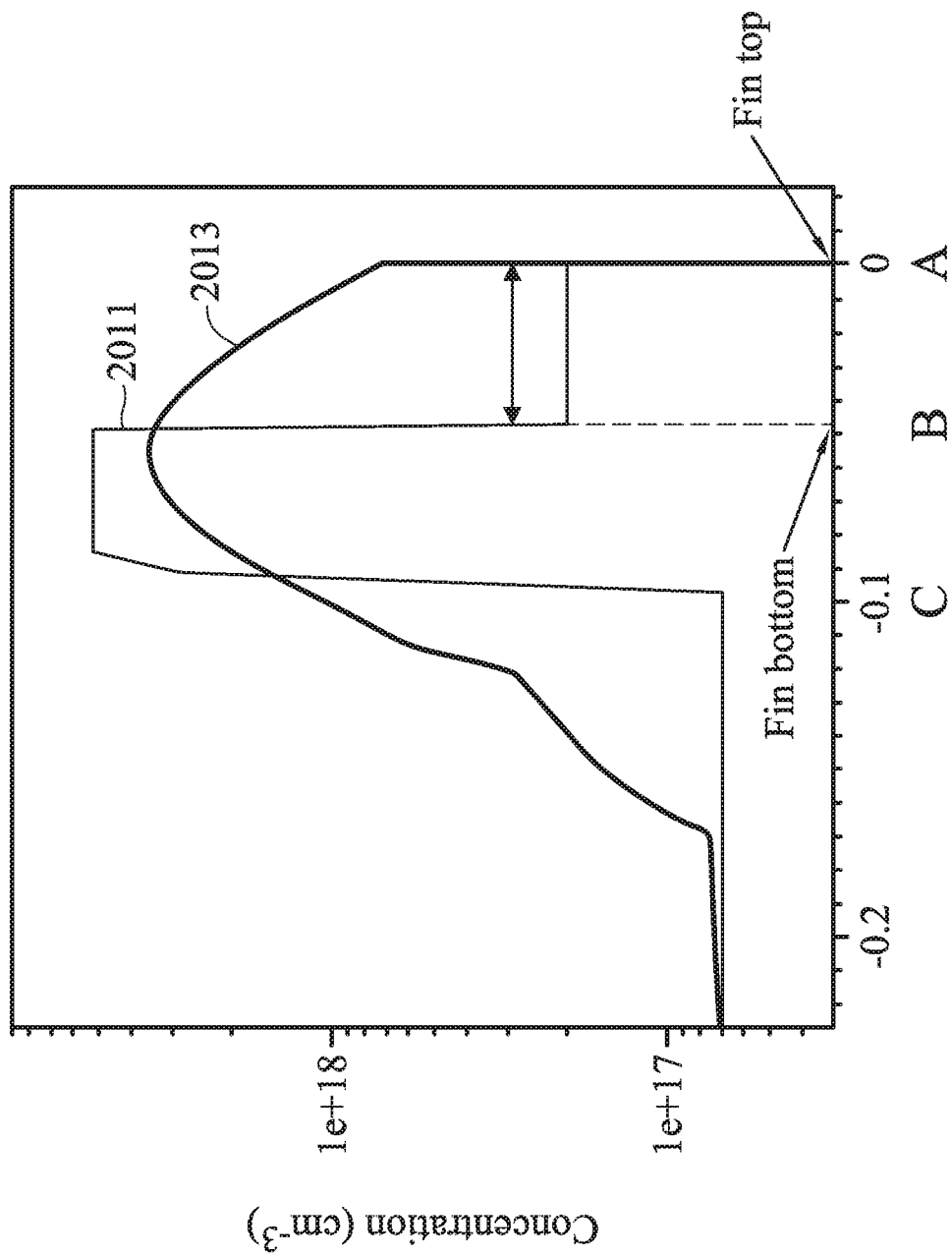
FIG. 20 illustrates simulation results for the dopant concentration of a semiconductor device formed using the presently disclosed methods, in some embodiments.

Referring temporarily to FIG. 20, Technology Computer-Aided Design (TCAD) simulations were performed to study the dopant (e.g., phosphorous for APT regions 129A, and boron for APT regions 129B) concentrations in different regions of semiconductor device 100 after APT regions 129 are formed using the presently disclosed method. Simulation results are illustrated by curve 2011. For comparison, dopant concentrations for a FinFET device using conventional implantation process for forming APT regions are illustrate by curve 2013. The x-axis of FIG. 20 denotes the distance in micrometers between a region of semiconductor device 100 and the top surface of upper fins 120A'/120B', with a negative value representing a region located below the top surface of upper fins 120A'/120B'. The y-axis shows the simulated dopant concentration. Therefore, in FIG. 20, point A on x-axis corresponds to the top surface of upper fins 120A'/120B', point B corresponds to the bottom of upper fins 120A'/120B', and point C corresponds to the bottom of semiconductor strips 121A/121B. As illustrated by curve 2011 in FIG. 20, at the interface between upper fins 120A'/120'B and semiconductor strips 121A/121B (e.g., point B on x-axis), there is a step increase in the dopant concentration from the side of upper fins 120A'/120B' to the side of semiconductor strips 121A/121B; at the interface between semiconductor strips 121A/121B and substrate 110 (e.g., point C on x-axis), there is a substantially step decrease in the dopant concentration from the side of semiconductor strips 121A/121B to the side of substrate 110. Curve 2011 illustrates advantages of the presently disclosed methods, which include precise control of the location of APT regions 129. Compared with the conventional method (e.g., curve 2013) of forming APT regions through implantation, the presently disclosed method increases dopant concentrations in the APT regions 129 efficiently, with little or no channel damage or degradation of channel mobility caused by the dopant used for forming APT regions 129, as evidenced by the step increase of dopant concentration at the interface between upper fins 120A'/120'B and semiconductor strips 121A/121B.

FIGS. 12-19 illustrate another embodiment of the present disclosure, wherein different implantation processes 270 and 280 (see FIGS. 16 and 17) were performed for PMOS region 101 and NMOS region 103, respectively, to accommodate different etching requirements for STI regions 150 in PMOS region 101 and NMOS region 103. In FIGS. 12-19, similar reference numbers generally denote similar parts as in FIGS. 1-11 unless otherwise specified.

Figure 12:
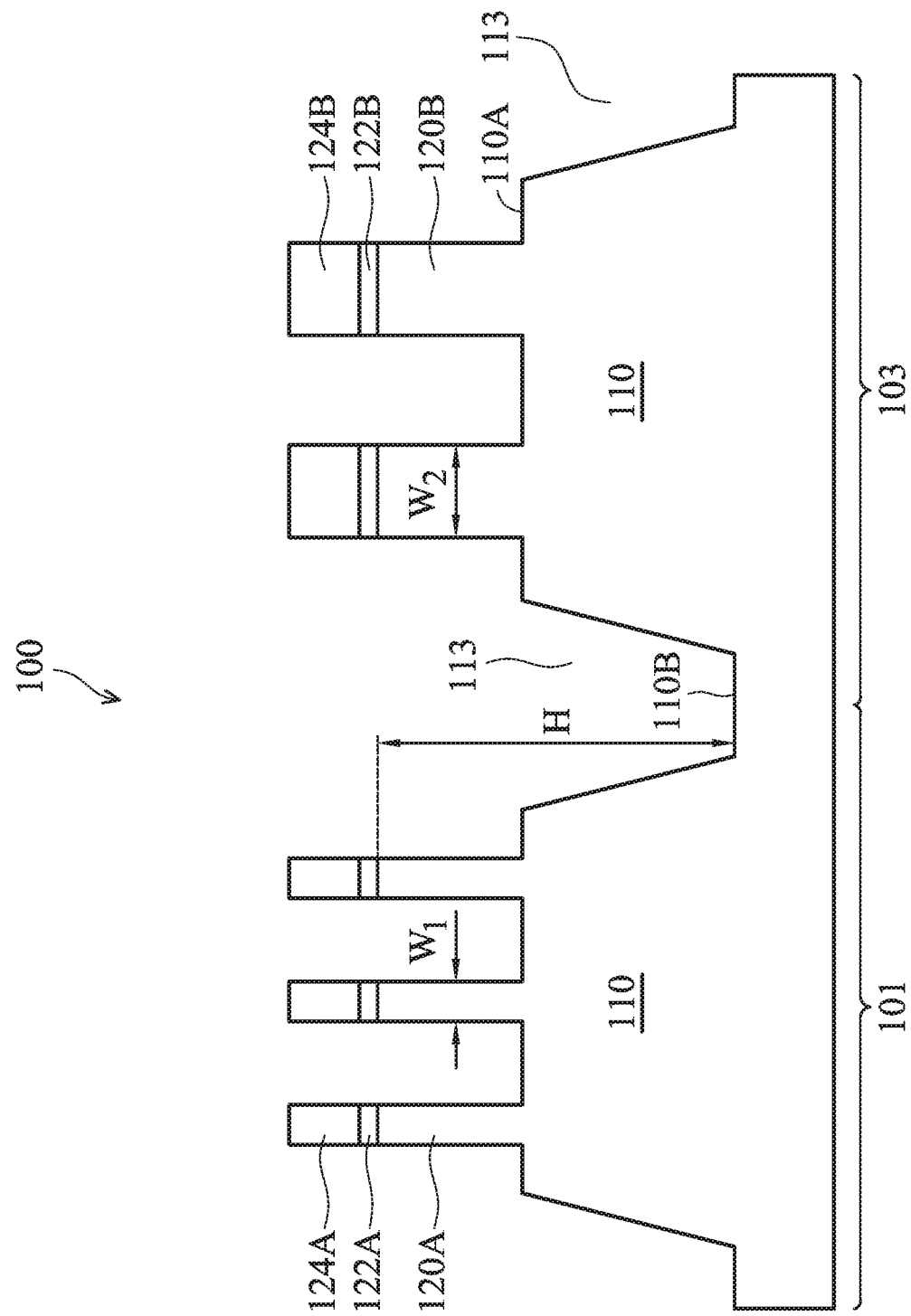
FIGS. 12-19 are cross-sectional views of a FinFET at various manufacturing stages, in accordance with other embodiments.

Referring to FIG. 12, the cross-sectional view of a semiconductor device 100 with a plurality of semiconductor fins 120A/120B extending from substrate 110 is illustrated. In the example of FIG. 12, semiconductor device 100 has a first region 101 and a second region 103. First region 101 may be a PMOS region 101 used for fabricating a P-type semiconductor device (e.g., a PMOSFET), and second region 103 may be an NMOS region 103 used for fabricating an N-type semiconductor device (e.g., an NMOSFET). In addition, first region 101 may be used for forming logic devices and may have a first plurality of fins 120A with a first width $W_1$, and second region 102 may be used for forming input-output (TO) devices and may have a second plurality of fins 120B with a second width $W_2$. The second width $W_2$ is different from the first width $W_1$ in the example of FIG. 12, due to, e.g., different design and/or performance requirements. In other embodiments, $W_2$ may be the same as $W_1$. Although FIG. 12 shows two regions 101 and 103, semiconductor device 100 may include other numbers of fins 120A/120B and other numbers of regions, such as one or more than two regions, and that different regions of semiconductor device 100 may be of the same or different types (e.g., PMOS region or NMOS region). The discussion hereinafter uses the example of a PMOS region 101 and an NMOS region 103 for illustration purpose, one skilled in the art, upon reading this disclosure, will be able to readily apply the principles of this disclosure to semiconductor devices with other numbers and/or types of regions with any numbers of fins.

Fins 120A/120B may be formed following similar processing using, e.g., lithography and etching, as described above with reference to FIG. 1, and details are not repeated here. After fins 120A/120B are formed, trenches 113 are formed with a depth H measured from a top surface of fins 120A/120B to upper surfaces 110B of substrate 110, which depth H may be about 1200 Å.

Figure 13:
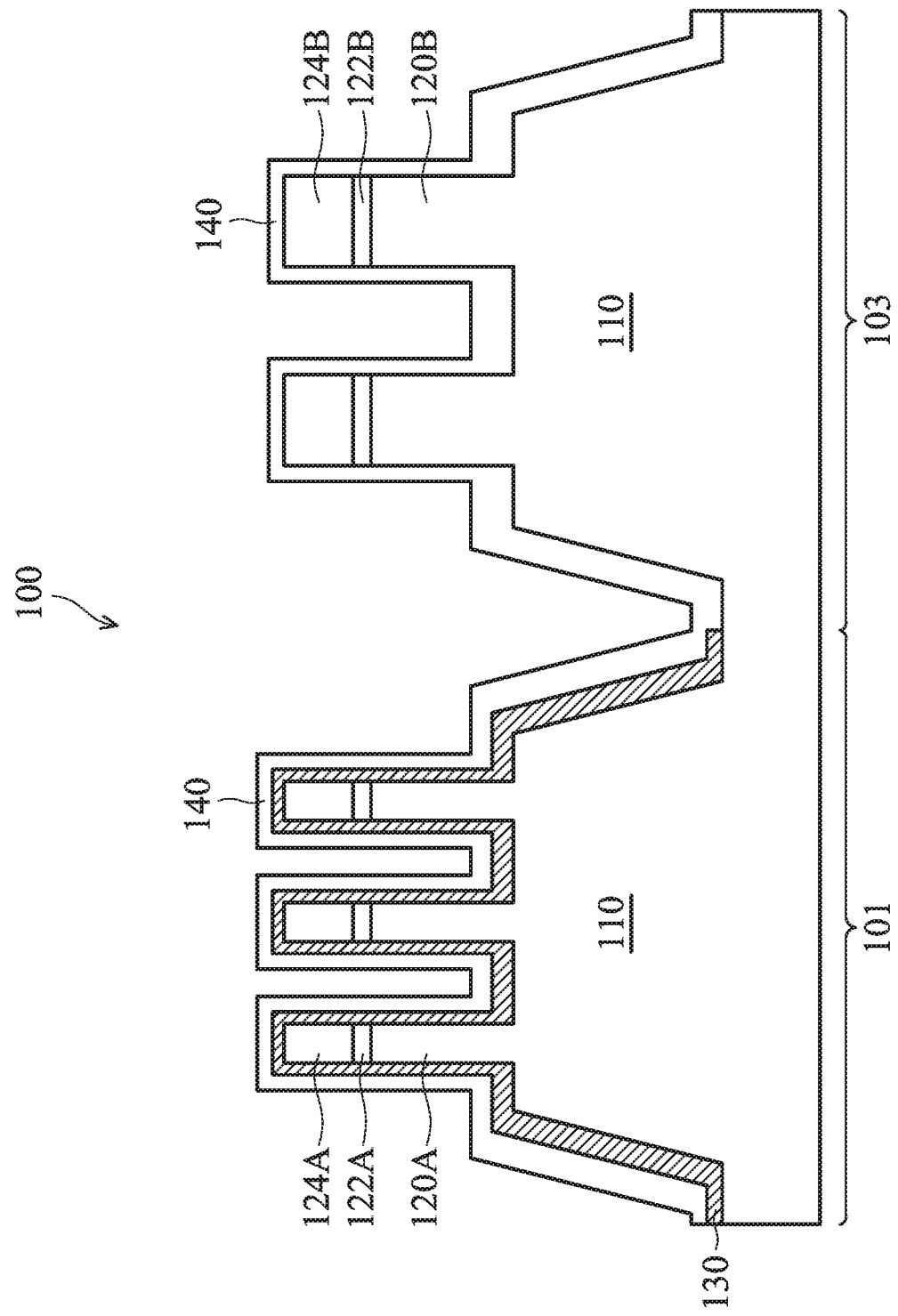

Next, referring to FIG. 13, PSG film 130 is formed over PMOS region 101, and BSG film 140 is formed over PSG film 130 and NMOS region 103, using processes similar to those described above with reference to FIGS. 2-4.

Figure 14:
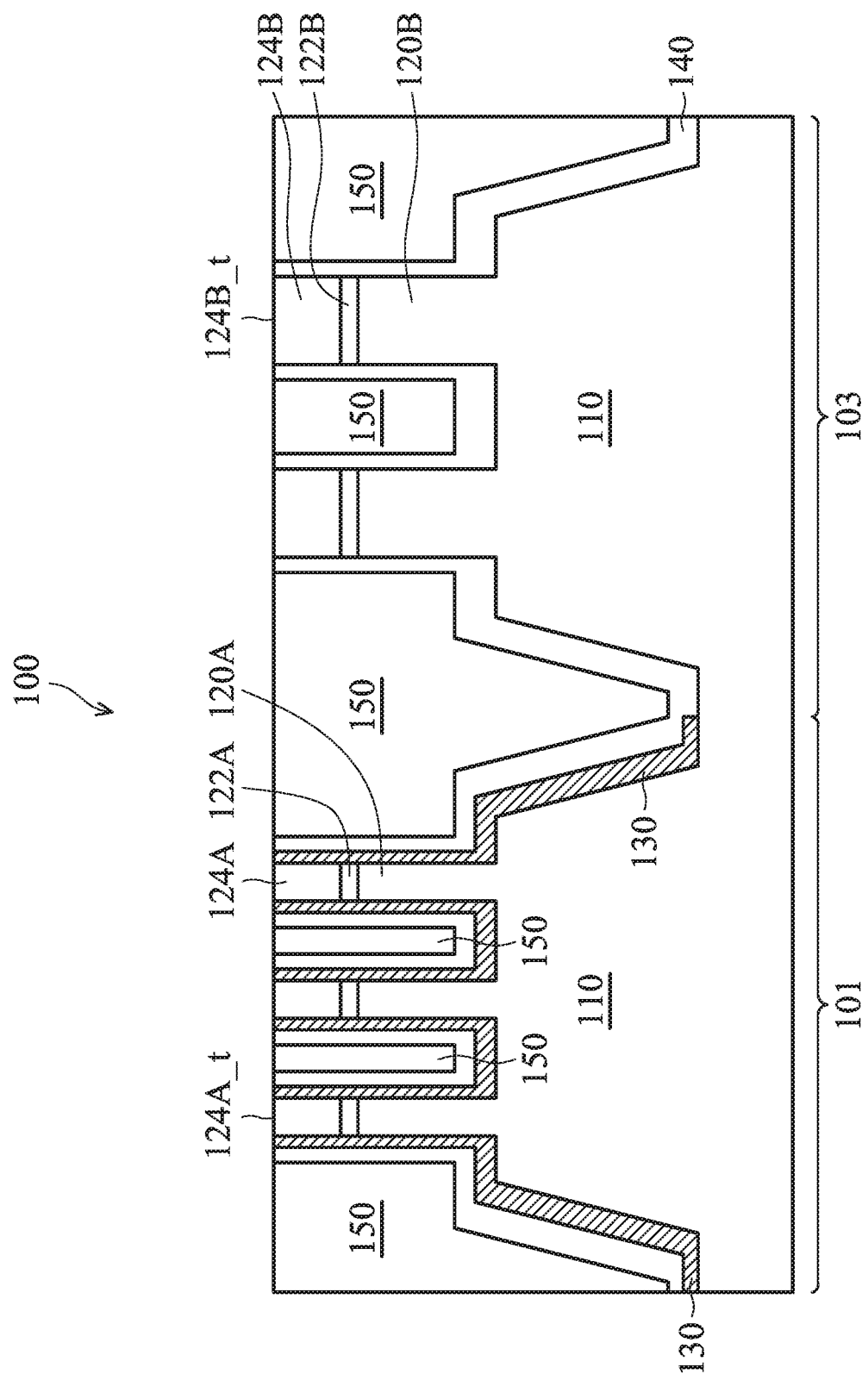

Referring to FIG. 14, dielectric film 150 is formed over fins 120A/120B, PSG film 130, BSG film 140, and substrate 110 using an FCVD process, followed by a first low-temperature anneal and a planarization process to expose upper surfaces 124A_t and 124B_t of pad nitride layers 124A and 124B, respectively, following similar steps as described above with references to FIGS. 5-6. Similar to FIG. 6, a second low-temperature anneal may be performed after the planarization process.

Figure 15:
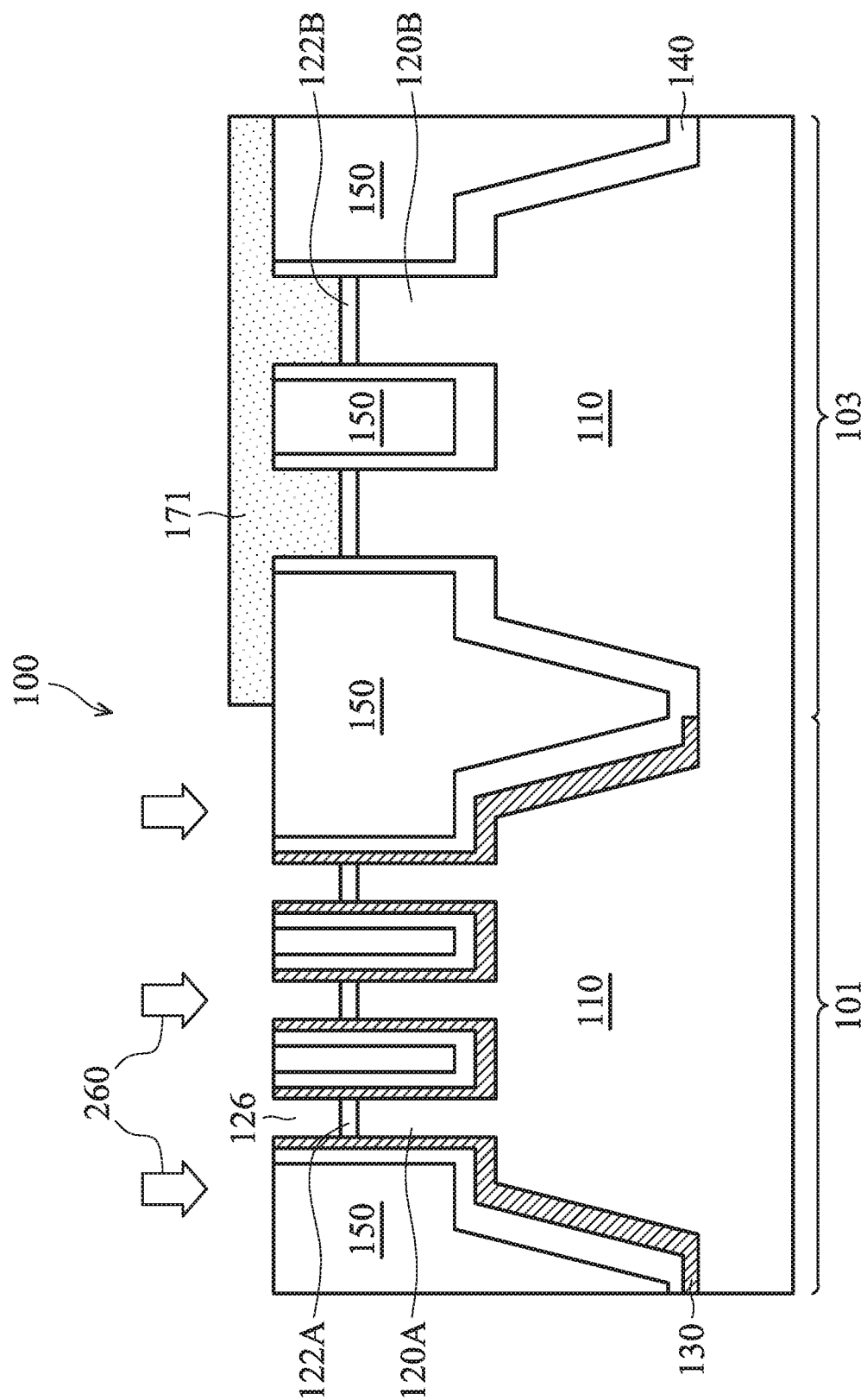

Next, as illustrated by FIG. 15, pad nitride layers 124A/124B are removed, and the well loop processing for semiconductor device 100 is performed, following similar steps as illustrated in FIGS. 7-8. As illustrated in FIG. 15, an implantation process 260 is performed for PMOS region 101 to form N-wells while NMOS region 103 is covered by a mask layer 171 to shield NMOS region 103 from implantation process 260. Note that FIG. 15 may only illustrate one step of a series of processing steps in the well loop process. Other processing steps, such as steps to form P-wells in NMOS region 103, are not illustrated in FIG. 15.

Figure 16:
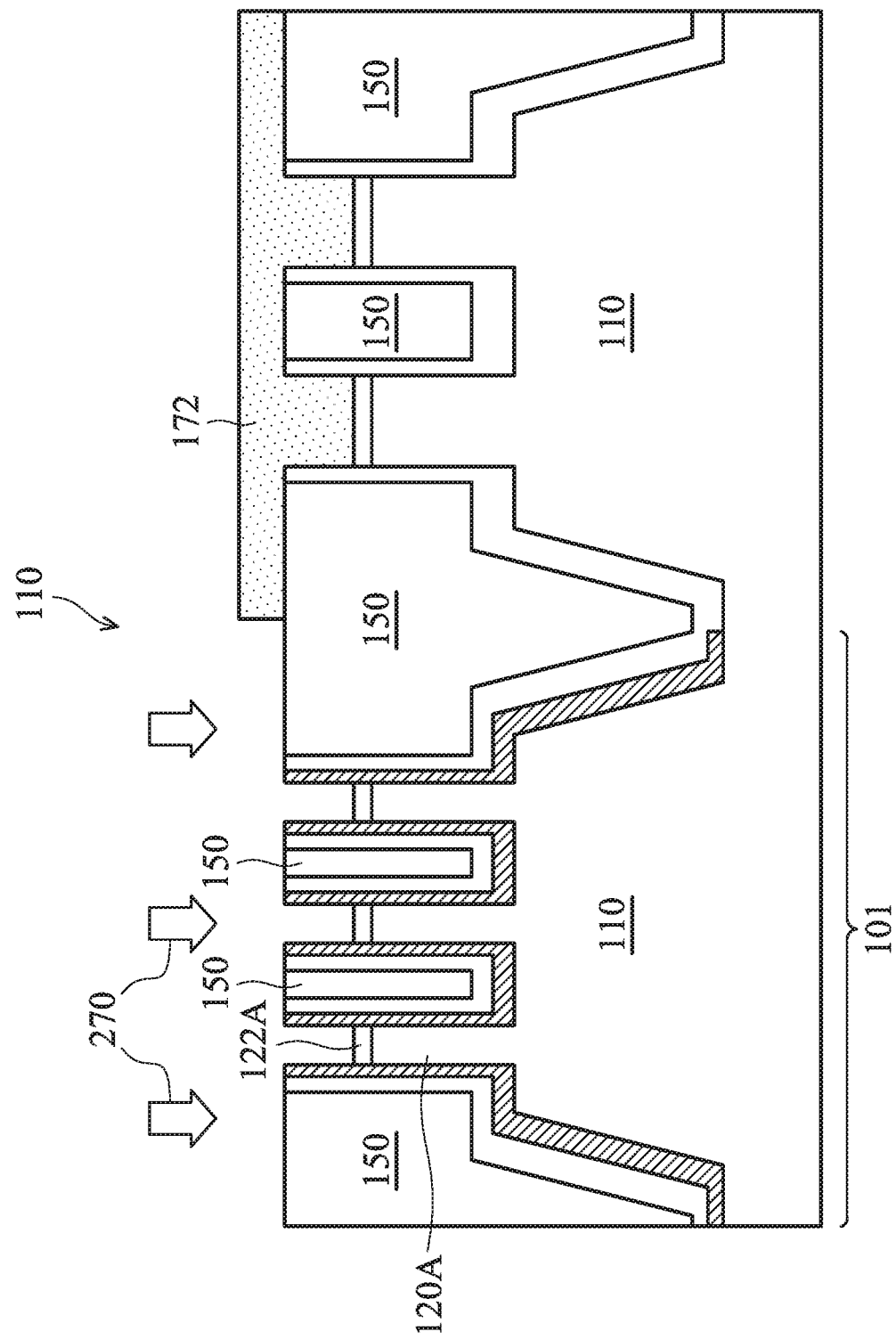

Next, referring to FIG. 16, an implantation process 270 is performed for PMOS region 101 to modify the qualities (e.g., hardness, and/or WER) of film 150 disposed in region 101, while NMOS region 103 is covered by a mask layer 172 to shield NMOS region 103 from implantation process 270. Mask layer 172 may be a patterned photo resist layer or other suitable material for a mask layer. Implantation process 270 uses $H_e$ as dopant and an implantation energy of about 3 keV, in some embodiments. Other parameters of implantation process 270 may be similar to implantation process 240 in FIG. 9 and may include a dopant concentration between about 1E15 $cm^{-2}$ and about 1E16 $cm^{-2}$, and a temperature between about 200° C. to about 500° C. Implantation process 270 reduces the WER of film 150, in some embodiments. In other embodiments, any suitable dopant, such as $H_e$, $O_2$, $N_2$, C, or combinations thereof, may be used as the dopant for implantation process 270, and the implantation energy may be adjusted to more or less than 3 keV according to the fin height and other design factors.

Figure 17:
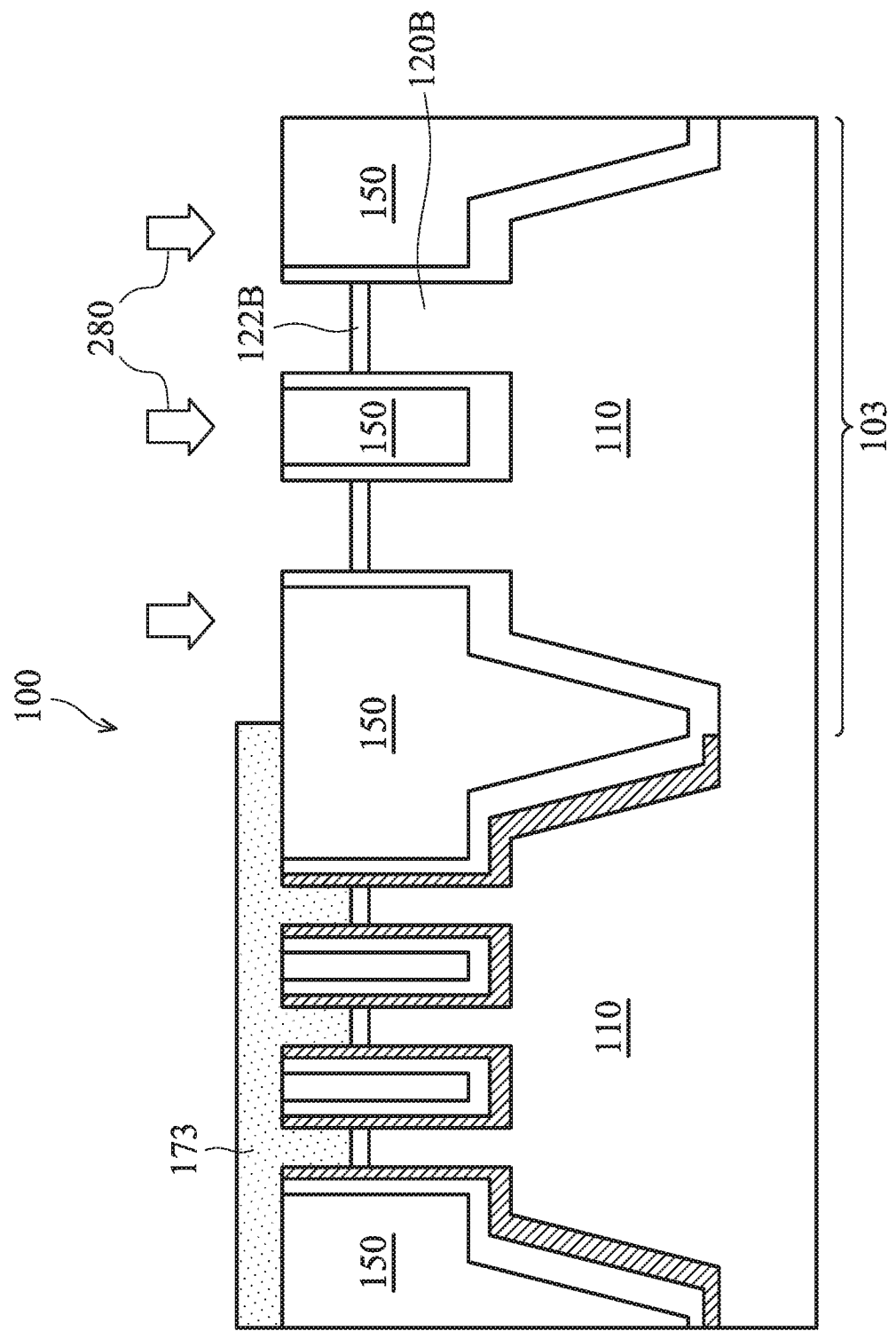

As illustrated in FIG. 17, after the processing in FIG. 16, another implantation process 280 is performed for NMOS region 103 to modify the qualities (e.g., hardness, and/or WER) of film 150 disposed in region 103, while PMOS region 101 is covered by a mask layer 173 to shield PMOS region 101 from implantation process 280. Mask layer 173 may be a patterned photo resist layer, and may comprise the same material as mask layer 171. Implantation process 280 uses $H_e$ as dopant and an implantation energy different from the implantation energy of implantation process 270, in some embodiments. For example, an implantation energy of about 2 keV may be used for implantation process 280. Other implantation process parameters may be similar to implantation process 240 in FIG. 9 and may include a dopant concentration between about 1E15 cm$^{-2}$ and about 1E16 cm$^{-2}$, and a temperature between about 200° C. to about 500° C. In some embodiments, implantation process 280 reduces the WER of film 150. In other embodiments, any suitable dopant, such as H$_e$, O$_2$, N$_2$, C, or combinations thereof, may be used as the dopant for implantation process 280, and the implantation energy may be adjusted to more or less than 2 keV according to the fin height and other design factors. In addition, skilled artisan will appreciate that implantation process 270/280 could be used to modify qualities of ILD layers formed by an FCVD process.

By using different implantation energy (e.g., 3 keV and 2 keV) for film 150 disposed in regions 101 and 103, the qualities of film 150 disposed in regions 101 and 103 are modified differently. For example, film 150 in region 101 may have a slower WER (e.g., more resistant to a subsequent wet etch process) than film 150 in region 103 due to exposure to more implantation energy, while film 150 in both regions 101 and 103 have improved WER such that substantially level upper surfaces could be obtained in a subsequent removal process (e.g., a wet etch process) to remove upper portions of film 150 to form STI regions 150.

Referring now to FIG. 18, film 150 is recessed by a suitable process such as a wet etch process using a suitable etchant to form STI regions 150, similar to the processing of FIG. 10. After the recess process, portions of fins 120A/120B that extend above upper surfaces 150UA/150UB of STI regions 150 are referred to as upper fins 120A'/120B', and portions of fins 120A/120B that extend below upper surfaces 150UA/150UB of STI regions 150 are referred to as semiconductor strips 121A/121B. Note that due to the different modified qualities (e.g., modified WER by implantation process 270/280) of film 150 disposed in regions 101 and 103, upper surface 150UA in regions 101 is not level with upper surface 150UB in region 103. For example, upper surface 150UA may be higher (e.g., extends further away from substrate 110) than upper surface 150UB by a distance a (also referred to as offset a), which distance a might be about 5 nanometer (nm), although other dimensions are also possible depending on, e.g., design requirements. Despite the offset a between upper surfaces 150UA and 150UB, each of upper surfaces 150UA and 150UB is substantially level, due to the improved WER provided by implantations process 270/280, in some embodiments. The offset a may be used to advantageously accommodate design requirements for different fin heights in different regions (e.g., PMOS region and NMOS region) of semiconductor device 100. For example, different fin heights may be used to balance the performance difference of different types of devices in PMOS and NMOS regions. The offset a may also be used to compensate for the loading effect of semiconductor device 100, e.g., in cases where it is desirable to have equal fin heights in different regions (e.g., regions with different pattern densities) of semiconductor device.

Skilled artisan will recognized many variations of the above disclosed method. For example, other parameters of the implantation process 270/280 may be modified to achieve different WER for film 150 disposed in regions 101 and 103. Other offset a (e.g., different value, and/or different sign) may be obtained by adjusting the difference in WER for film 150 disposed in regions 101 and 103. Although FIGS. 16 and 17 shows performing implantation process 270 for PMOS region 101 before implantation process 280 for NMOS region 103, one could modify the sequence of processing and perform implantation process 280 before implantation process 270, for example. In addition, it is possible to combine the well loop processing with implantation process 270/280 such that the same mask layer could be used in a well loop implantation process and a subsequent implantation process for modifying WER of film 150. For example, mask layer 171 in FIG. 15 could be used to shield region 103 during the well loop implantation process 260 for region 101, after which implantation process 270 can be performed to change the WER of film 150 in region 101 using mask layer 171, thus obviating the step of forming mask layer 172 in FIG. 16. Other variations or modifications might be possible and are within the scope of the present disclosure.

Figure 19:
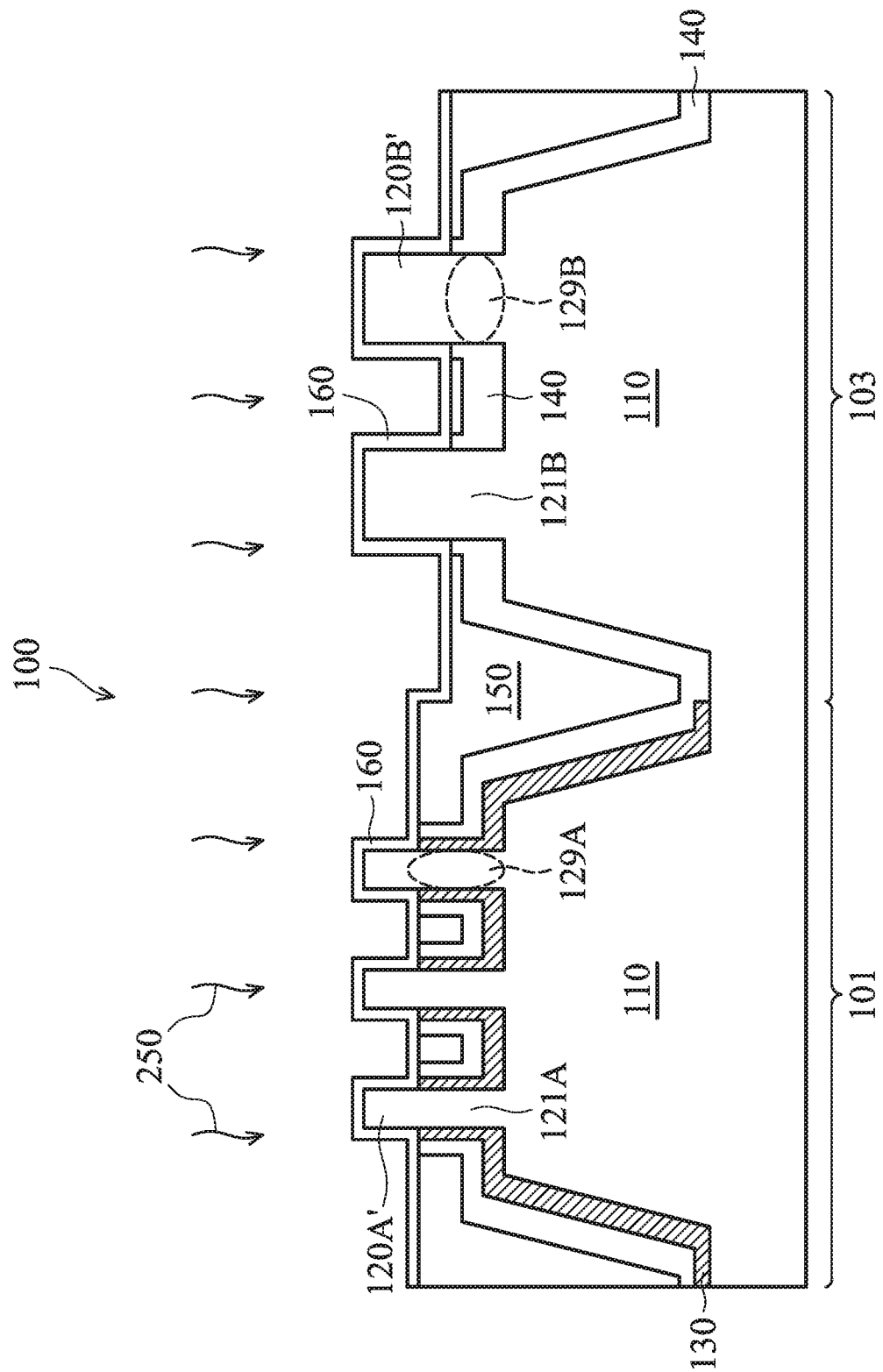

Next, referring to FIG. 19, dielectric layer 160 is formed over region 101 and region 103, followed by a high temperature anneal process 250, following similar processing as shown in FIG. 11. APT regions 129A/129B are formed in semiconductor strips 121A/121B by the high temperature anneal process 250, similar to FIG. 11, in some embodiments. Dopant (e.g., phosphorus for PSG film 130 and boron for BSG film 140) concentrations of semiconductor device 100 exhibits similar step increase and step decrease as illustrated in FIG. 20, in various embodiments. Advantages of the present disclosure include precise control of the location of APT regions 129, and compared with the conventional method of forming APT regions through implantation, the presently disclosed method increases dopant concentrations in the APT regions 129 efficiently, with little or no channel damage or degradation of channel mobility. Further processing (not shown) may be performed to finish the fabrication of FinFET device 100, and may include additional steps such as forming gate electrodes, interlayer dielectrics (ILDs), and contacts, as skilled artisans readily appreciate.

While the embodiments of the present disclosure use a semiconductor device with a PMOS region and a CMOS region as examples, skilled artisans will recognize that many variations for the combination of regions (e.g., types of regions, numbers of regions) on semiconductor device 100 are possible and are within the scope of the present disclosure. For example, semiconductor device 100 may have one region or more than two regions, and each region may be a PMOS region or a NMOS region. As another example, the disclosed methods may be used for a semiconductor device 100 with one or more NMOS regions alone, or one or more PMOS regions alone.

Figure 21:
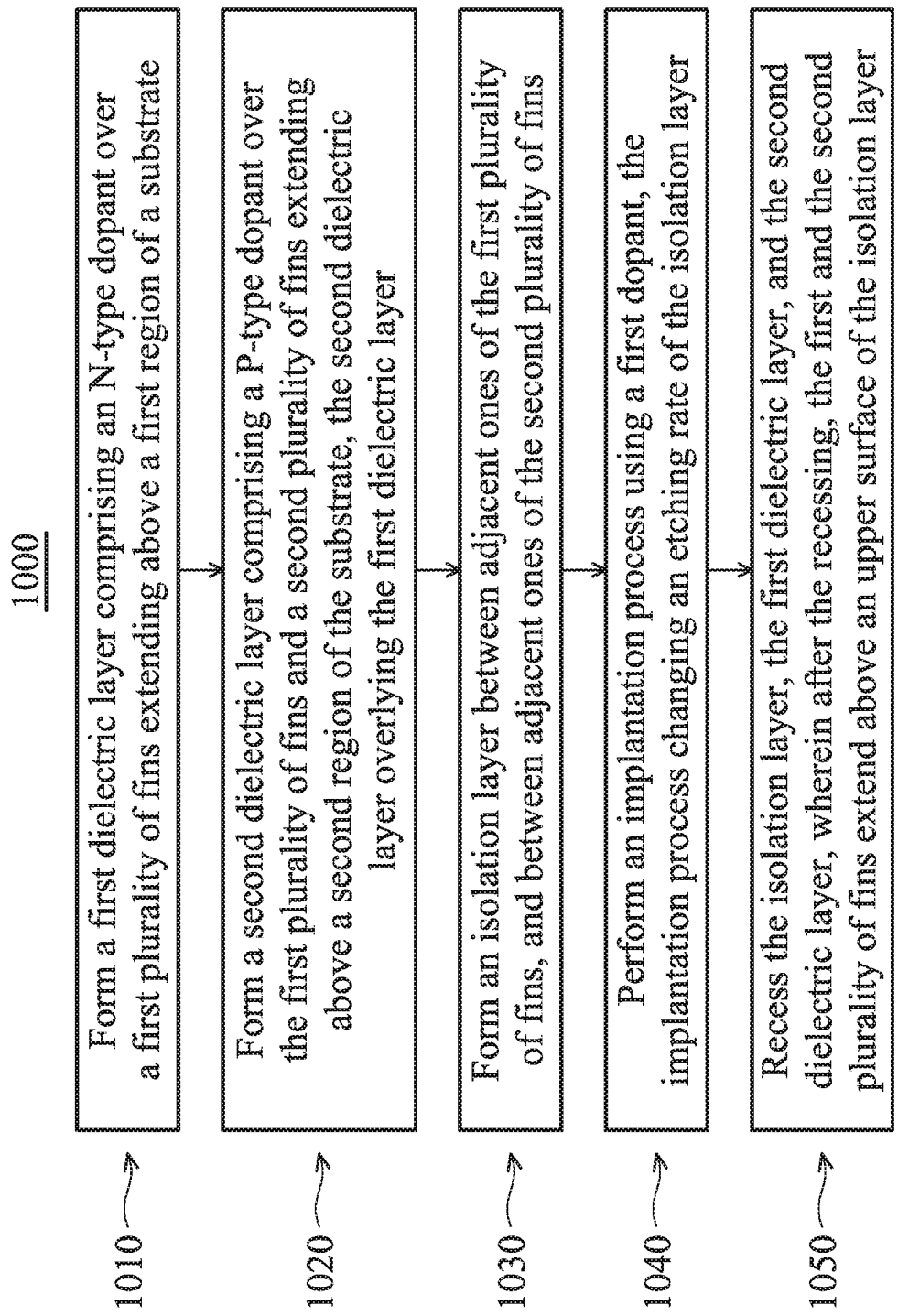
FIG. 21 is a flow chart of a method of semiconductor processing, in accordance with an embodiment of the present disclosure.

FIG. 21 illustrates a flow chart of a method for fabricating a dielectric film, in accordance with some embodiments. It should be understood that the embodiment methods shown in FIG. 21 is an example of many possible embodiment methods. One of ordinary skill in the art would recognize many variations, alternatives, and modifications. For example, various steps as illustrated in FIG. 21 may be added, removed, replaced, rearranged and repeated.

Referring to FIG. 21, at step 1010, a first dielectric layer comprising an N-type dopant is formed over a first plurality of fins extending above a first region of a substrate. At step 1020, a second dielectric layer comprising a P-type dopant is formed over the first plurality of fins and a second plurality of fins extending above a second region of the substrate, the second dielectric layer overlying the first dielectric layer. At step 1030, an isolation layer is formed between adjacent ones of the first plurality of fins, and between adjacent ones of the second plurality of fins. At step 1040, an implantation process is performed using a first dopant, the implantation process changing an etching rate of the isolation layer. At step 1050, the isolation layer, the first dielectric layer, and the second dielectric layer are recessed, where after the recessing, the first and the second plurality of fins extend above an upper surface of the isolation layer.

Embodiments may achieve advantages. The disclosed methods modifies physical and/or mechanical properties (e.g., hardness and/or WER) of a dielectric layer formed by an FCVD process using dopant with light mass, such as $H_e$. Properties of the dielectric layer are modified with little or no damage to the fins of semiconductor device due to the light mass of the dopant. A 2× improvement of WER is achieved in some embodiments. The improved properties of dielectric layer results in substantially flat upper surfaces of STI regions formed by recessing (e.g., using a wet etch process) top portions of the dielectric layer, thus reducing or preventing fin recess non-uniformity. Fin height uniformity is improved, resulting in improved on-current $I_{on}$ of semiconductor device and improved uniformity for drain current $I_{drain}$. In addition, good well isolation and low leakage current are provided by the substantially flat upper surface of STI regions. Additional advantages include the ability to control the properties of the dielectric layer by controlling the parameters of the implantation process (e.g., implantation process 270/280), and the ability to control locations and dopant concentrations of the anti-punch through (APT) regions with little or no adverse effect on the channel mobility.

In accordance with some embodiments, a method for semiconductor processing includes forming a first dielectric layer comprising an N-type dopant over a first plurality of fins extending above a first region of a substrate, forming a second dielectric layer comprising a P-type dopant over the first plurality of fins and a second plurality of fins extending above a second region of the substrate, the second dielectric layer overlying the first dielectric layer, and forming an isolation layer between adjacent ones of the first plurality of fins, and between adjacent ones of the second plurality of fins. The method further includes performing an implantation process using a first dopant, the implantation process changing an etching rate of the isolation layer, and recessing the isolation layer, the first dielectric layer, and the second dielectric layer, where after the recessing, the first and the second plurality of fins extend above an upper surface of the isolation layer.

In accordance with other embodiments, a method of forming a Fin Field-Effect (FinFET) transistor includes forming a phosphosilicate glass (PSG) film over a first fin in a first region of a substrate, forming a borosilicate glass (BSG film) over the PSG film and a second fin in a second region of the substrate, forming a dielectric layer in the first region and the second region of the substrate and adjacent the first fin and the second fin, and implanting a dopant in the dielectric layer, where the implanting decreases an etching rate of the dielectric layer.

In accordance with yet other embodiments, a semiconductor structure includes a first upper fin in a PMOS region of a substrate overlying a first semiconductor strip, a second upper fin in an NMOS region of the substrate overlying a second semiconductor strip, and shallow trench isolation (STI) regions on opposing sides of each of the first upper fin and the second upper fin. The first upper fin extends above a first upper surface of a first STI region proximate the first upper fin, the second upper fin extends above a second upper surface of a second STI region proximate the second upper fin. The semiconductor structure also includes a first dielectric film between the first STI region and the first semiconductor strip, and between the second STI region and the second semiconductor strip, with the first dielectric film contacting the second semiconductor strip. The semiconductor structure further includes a second dielectric film between the first semiconductor strip and the first dielectric film, with the second dielectric film contacting the first semiconductor strip.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of semiconductor processing comprising:
   forming a first dielectric layer comprising an N-type dopant over a first plurality of fins extending above a first region of a substrate;
   forming a second dielectric layer comprising a P-type dopant over the first plurality of fins and over a second plurality of fins extending above a second region of the substrate, the second dielectric layer overlying the first dielectric layer, the second dielectric layer contacting the first dielectric layer along sidewalls of the first plurality of fins;
   forming an isolation layer between adjacent ones of the first plurality of fins, and between adjacent ones of the second plurality of fins;
   performing an implantation process using a first dopant, the implantation process changing an etching rate of the isolation layer; and
   recessing the isolation layer, the first dielectric layer, and the second dielectric layer, wherein after the recessing, the first and the second plurality of fins extend above upper surfaces of the isolation layer.

2. The method of claim 1, wherein the first dielectric layer comprises phosphosilicate glass (PSG), and the second dielectric layer comprises borosilicate glass (BSG).

3. The method of claim 1, wherein the performing the implantation process reduces the etching rate of the isolation layer.

4. The method of claim 1, wherein the isolation layer is formed by a flowable chemical vapor deposition (FCVD) process.

5. The method of claim 4, wherein the forming the isolation layer comprises:
   depositing the isolation layer over the first and the second plurality of fins using the FCVD process, the isolation layer extending above top surfaces of the first and the second plurality of fins;
   performing a first thermal anneal process after the depositing; and
   removing a top portion of the isolation layer to expose a first mask layer of each of the first and the second plurality of fins after the performing the first thermal anneal process.

6. The method of claim 5, further comprising performing a second thermal anneal process after the removing the top portion of the isolation layer.

7. The method of claim 6, wherein the first thermal anneal process and the second thermal anneal process are performed at a first temperature between about 300° C. to about 700° C.

8. The method of claim 6, further comprising removing the first mask layer of each of the first and the second plurality of fins before the performing the implantation process.

9. The method of claim 4, wherein the implantation process is performed using a dopant comprising He.

10. The method of claim 9, wherein the implantation process is performed with an implantation energy between about 3 keV to about 5 keV, a dosage between about 1E15 cm$^{-2}$ to about 1E16 cm$^{-2}$, and at a temperature between about 200° C. to about 500° C.

11. The method of claim 9, wherein the performing the implantation process comprises:
performing a first implantation process for a first portion of the isolation layer disposed over the first region of the substrate with a first implantation energy, wherein a second portion of the isolation layer disposed over the second region of the substrate is shielded from the first implantation process; and
performing a second implantation process for the second portion of the isolation layer with a second implantation energy smaller than the first implantation energy, wherein the first portion of the isolation layer is shielded from the second implantation process.

12. The method of claim 11, wherein after the recessing, a first fin height of the first plurality of fins is larger than a second fin height of the second plurality of fins.

13. The method of claim 1, wherein forming the isolation layer comprises performing a first thermal anneal process at a first temperature, wherein the method further comprises performing a second thermal anneal process at a second temperature after the recessing, wherein the second temperature is higher than the first temperature.

14. A method of forming a Fin Field-Effect (FinFET) device comprising:
forming a first fin in a first region of a substrate;
forming a second fin in a second region of the substrate;
forming a dielectric layer over the substrate, wherein the dielectric layer is on opposing sides of the first fin and on opposing side of the second fin; and
implanting a dopant in the dielectric layer, wherein the implanting decreases an etching rate of the dielectric layer, wherein the dopant is selected from the group consisting of helium, nitrogen, oxygen, and carbon, wherein the implanting comprises:
performing a first implantation process with a first implantation energy in the first region of the substrate while the second region of the substrate is covered by a second implantation mask; and
performing a second implantation process with a second implantation energy smaller than the first implantation energy in the second region of the substrate while the first region of the substrate is covered by a first implantation mask.

15. The method of claim 14, wherein the dielectric layer is formed by a flowable chemical vapor deposition (FCVD) process.

16. The method of claim 14, wherein the implanting is performed with an implantation energy between about 3 keV to about 5 keV, a dosage between about 1E15 cm$^{-2}$ to about 1E16 cm$^{-2}$, and at a temperature between about 200° C. to about 500° C.

17. The method of claim 14, further comprising recessing the dielectric layer to expose top portions of the first fin and the second fin, wherein the recessing removes a first portion of the dielectric layer in the first region, and a second portion of the dielectric layer in the second region, and wherein a first thickness of the first portion is smaller than a second thickness of the second portion.

18. A semiconductor structure comprising:
a first upper fin in a PMOS region of a substrate overlying a first semiconductor strip;
a second upper fin in an NMOS region of the substrate overlying a second semiconductor strip;
shallow trench isolation (STI) regions on opposing sides of each of the first upper fin and the second upper fin, wherein the first upper fin extends above a first upper surface of a first STI region proximate the first upper fin, wherein the second upper fin extends above a second upper surface of a second STI region proximate the second upper fin;
a first dielectric film between the first STI region and the first semiconductor strip, and between the second STI region and the second semiconductor strip, the first dielectric film contacting the second semiconductor strip; and
a second dielectric film between the first semiconductor strip and the first dielectric film, the second dielectric film contacting the first semiconductor strip.

19. The semiconductor structure of claim 18, wherein the first dielectric film comprises a P-type dopant, and wherein the second dielectric film comprises an N-type dopant.

20. The semiconductor structure of claim 19, wherein there are anti-punch through (APT) regions in the first semiconductor strip and the second semiconductor strip, and wherein the first upper surface of the first STI region extends further away from the substrate than the second upper surface of the second STI region.

* * * * *